(12) United States Patent
Yue et al.

(10) Patent No.: US 10,644,142 B2
(45) Date of Patent: May 5, 2020

(54) SEMICONDUCTOR DEVICES WITH DOPED REGIONS FUNCTIONING AS ENHANCED RESISTIVITY REGIONS OR DIFFUSION BARRIERS, AND METHODS OF FABRICATION THEREFOR

(71) Applicant: NXP USA, Inc., Austin, TX (US)

(72) Inventors: Yuanzheng Yue, Chandler, AZ (US); David Cobb Burdeaux, Chandler, AZ (US); Jenn Hwa Huang, Chandler, AZ (US); Bruce McRae Green, Gilbert, AZ (US); James Allen Teplik, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/853,544

(22) Filed: Dec. 22, 2017

(65) Prior Publication Data
US 2019/0198623 A1 Jun. 27, 2019

(51) Int. Cl.
*H01L 29/778* (2006.01)
*H01L 29/10* (2006.01)
(Continued)

(52) U.S. Cl.
CPC ...... *H01L 29/7786* (2013.01); *H01L 21/2233* (2013.01); *H01L 21/2253* (2013.01);
(Continued)

(58) Field of Classification Search
CPC ......... H01L 29/66431; H01L 29/66462; H01L 29/778–7789; H01L 2924/13064;
(Continued)

(56) References Cited

U.S. PATENT DOCUMENTS

| 4,980,731 A * | 12/1990 | Hida | ...... H01L 29/267 257/192 |
| 7,538,010 B2 | 5/2009 | Faure et al. | |

(Continued)

OTHER PUBLICATIONS

Rajagopal, P. "Symposium Y: GAN and Related Alloys, MOCVD AlGaN/GaN HFETs on Si: Challenges and Issues", 6 pgs (Jan. 2003).

(Continued)

*Primary Examiner* — Scott B Geyer
(74) *Attorney, Agent, or Firm* — Sherry W. Schumm

(57) ABSTRACT

A semiconductor device includes a base substrate, a doped region at an upper surface of the base substrate, and a transistor over the upper surface of the base substrate and formed from a plurality of epitaxially-grown semiconductor layers. The doped region includes one or more ion species, and has a lower boundary above a lower surface of the base substrate. The base substrate may be a silicon substrate, and the transistor may be a GaN HEMT formed from a plurality of heteroepitaxial layers that include aluminum nitride and/or aluminum gallium nitride. The doped region may be a diffusion barrier region and/or an enhanced resistivity region. The ion species may be selected from phosphorus, arsenic, antimony, bismuth, argon, helium, nitrogen, and oxygen. When the ion species includes oxygen, the doped region may include a silicon dioxide layer formed from annealing the doped region after introduction of the oxygen.

13 Claims, 8 Drawing Sheets

(51) Int. Cl.
*H01L 29/32* (2006.01)
*H01L 29/36* (2006.01)
*H01L 21/223* (2006.01)
*H01L 21/225* (2006.01)
*H01L 29/20* (2006.01)
*H01L 29/66* (2006.01)

(52) U.S. Cl.
CPC ...... *H01L 29/1075* (2013.01); *H01L 29/2003* (2013.01); *H01L 29/32* (2013.01); *H01L 29/36* (2013.01); *H01L 29/66462* (2013.01)

(58) Field of Classification Search
CPC ... H01L 29/122–127; H01L 29/15–158; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 29/06–0638; H01L 29/36–365; C23C 14/48
See application file for complete search history.

(56) References Cited

U.S. PATENT DOCUMENTS

| | | | |
|---|---|---|---|
| 7,772,602 B2 | 8/2010 | Lee et al. | |
| 8,183,124 B2 | 5/2012 | Mazzola | |
| 9,627,473 B2 | 4/2017 | Roberts et al. | |
| 9,673,281 B2 | 6/2017 | Linthicum et al. | |
| 9,960,265 B1* | 5/2018 | Banerjee | H01L 29/66462 |
| 2003/0020092 A1 | 1/2003 | Parikh et al. | |
| 2007/0235775 A1 | 10/2007 | Wu et al. | |
| 2007/0272945 A1* | 11/2007 | Matsuo | H01L 29/155 257/194 |
| 2008/0124851 A1 | 5/2008 | Zhang et al. | |
| 2009/0189190 A1 | 7/2009 | Hashimoto et al. | |
| 2010/0096668 A1 | 4/2010 | Briere | |
| 2010/0117118 A1 | 5/2010 | Dabiran et al. | |
| 2011/0291160 A1* | 12/2011 | Ota | H01L 29/1029 257/194 |
| 2012/0153300 A1* | 6/2012 | Lidow | H01L 21/743 257/77 |
| 2013/0200495 A1* | 8/2013 | Keller | H01L 21/0237 257/615 |
| 2013/0240901 A1* | 9/2013 | Kohda | H01L 29/2003 257/76 |
| 2014/0103398 A1 | 4/2014 | Curatola et al. | |
| 2014/0175517 A1* | 6/2014 | Cheng | H01L 29/36 257/194 |
| 2016/0043219 A1* | 2/2016 | Liu | H01L 29/7827 257/329 |
| 2016/0163845 A1* | 6/2016 | Endoh | H01L 29/365 257/194 |
| 2017/0018457 A1* | 1/2017 | Schulze | H01L 21/76841 |
| 2017/0018638 A1* | 1/2017 | Teo | H01L 29/7784 |
| 2017/0033210 A1* | 2/2017 | Curatola | H01L 21/02381 |
| 2017/0069717 A1* | 3/2017 | Linthicum | H01L 29/1054 |
| 2017/0069722 A1* | 3/2017 | Linthicum | H01L 29/7783 |
| 2017/0125516 A1* | 5/2017 | Ishiguro | H01L 29/0638 |
| 2017/0278961 A1 | 9/2017 | Hill et al. | |
| 2018/0138306 A1* | 5/2018 | Jeon | H01L 29/66462 |

OTHER PUBLICATIONS

Pattison, L. "Improving GaN on Si Power Amplifiers through reduction of parasitic conduction layer", 9th European Microwave Integrated Circuit Conference, Rome, pp. 92-95 (Oct. 2014).

Valleta, et al; "Design and Characterization of Integrated Passive Elements on High Ohmic Silicon"; IEEE MTT-S Intl Microwave Symposium Digest, Philadelphia, PA, US; p. 1235 (Jun. 8, 2003).

Hilt, Oliver et al; "Improved Vertical Isolation for Normally-Off High Voltage GaN-EFETs on n-SiC Substrates"; IEEE Transactions on Electron Devices, vol. 60, No. 10; IEEE Service Center, Piscataway, NJ, US; pp. 3084-3090 (Oct. 2013).

* cited by examiner

SEMICONDUCTOR DEVICES WITH DOPED REGIONS FUNCTIONING AS ENHANCED RESISTIVITY REGIONS OR DIFFUSION BARRIERS, AND METHODS OF FABRICATION THEREFOR

TECHNICAL FIELD

Embodiments of the subject matter described herein relate generally to type III-N semiconductor devices, and more specifically to GaN transistor devices.

BACKGROUND

A typical gallium nitride (GaN) device (e.g., a GaN transistor) is fabricated by depositing a nucleation layer over a base semiconductor substrate, and subsequently depositing a buffer layer over the nucleation layer, where the nucleation layer functions to initiate epitaxial growth of the buffer layer. After deposition of the nucleation, buffer, and channel layers, additional GaN material, other semiconductor layers, and other structures (e.g., gate, drain, and source contacts) are formed over the buffer layer to complete the device.

GaN on a base semiconductor substrate of silicon carbide (SiC) is a technology that is now used extensively in RF and microwave applications. Although GaN on SiC devices may have significant performance advantages over their silicon-based counterparts, a major drawback of GaN on SiC technologies is the extremely high cost of the base semiconductor substrate. Accordingly, GaN developers continually strive to develop less expensive GaN-based devices that still exhibit the superior performance advantages over analogous silicon-based devices.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of type III-N devices (e.g., gallium nitride (GaN) devices) discussed herein include a silicon substrate, type III-N layers, and other material layers epitaxially grown and deposited over the silicon substrate. Using conventional processes, during growth of the epitaxial material on the substrate, gallium (Ga) and aluminum (Al) may diffuse into the substrate to form a P-type conduction layer at the substrate surface. This conduction layer may result in relatively-significant parasitic losses and may degrade the device performance. To address these issues, the various embodiments discussed herein include methods for forming doped region(s) in or on a silicon substrate, where the doped region(s) function to substantially prevent formation of the aforementioned P-type conduction layer at the substrate surface by counter-doping (e.g., to accommodate the Ga and Al diffusion) or by disrupting the crystal lattice to make the surface of the substrate less conductive.

In several more specific embodiments, during fabrication of a semiconductor device (e.g., a GaN transistor), an ion implantation process is performed to implant ions into at least a portion of the base semiconductor substrate surface before the epitaxial growth processes. In other embodiments, a layer of doped semiconductor material (e.g., doped silicon) is grown on the surface of the base semiconductor surface prior to subsequent epitaxial growth steps. In still other embodiments, the surface of the base semiconductor substrate is bombarded with ions to damage the crystal lattice at the base semiconductor substrate surface. In the semiconductor device, implementation of one of the various embodiments may reduce or prevent diffusion of gallium, aluminum, and/or other materials into the base semiconductor substrate during the subsequent epitaxial growth processes. This, in turn, may result in a reduction in parasitic losses and improved RF performance for a III-N device, when compared with similar devices in which such diffusion barrier regions are not formed.

Figure 1:
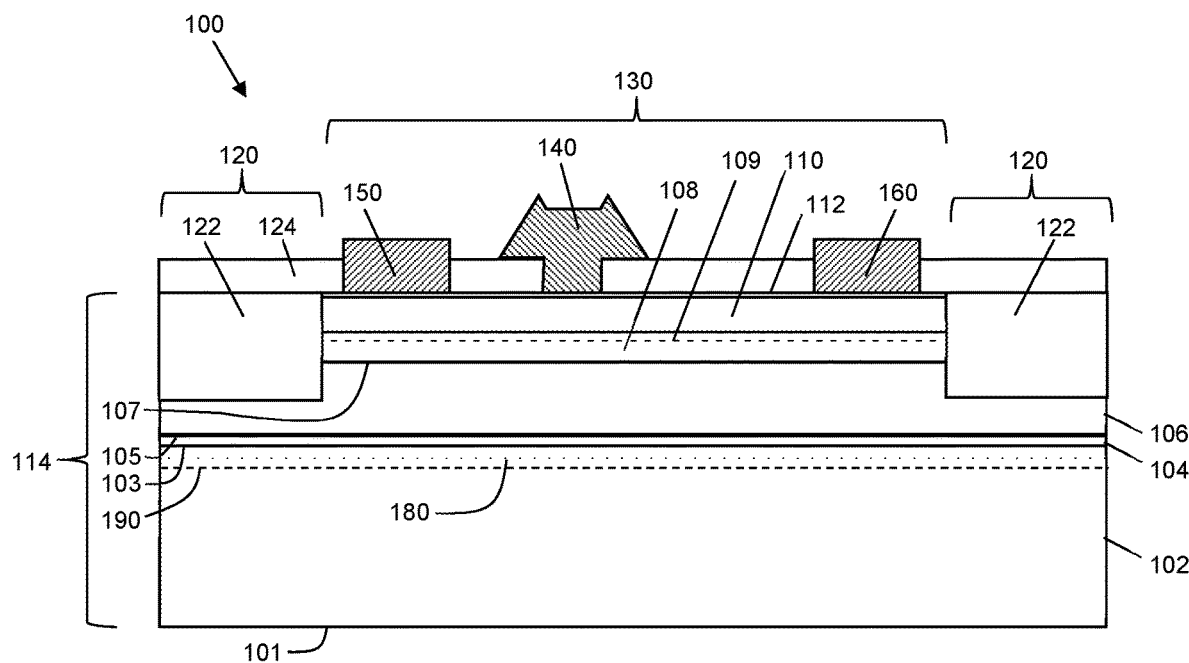
FIG. 1 is a cross-sectional, side view of a semiconductor device with a diffusion barrier in the base semiconductor substrate, in accordance with an example embodiment.

FIG. 1 is a cross-sectional, side view of a semiconductor device 100 with a diffusion barrier region 180 in an upper portion of the base semiconductor substrate 102, in accordance with an example embodiment. The semiconductor device 100 includes a semiconductor substrate 114, isolation regions 120, and an active region 130 within which a high electron mobility transistor (HEMT) is formed. The transistor includes a gate electrode 140, first and second current carrying contacts 150, 160 (e.g., source and drain contacts) formed over the substrate 114, and a channel 109 formed within the substrate 114. The isolation regions 120 separate the active region 130 (and the transistor) from other adjacent devices (not shown) that also may be formed in and over the semiconductor substrate 114.

The semiconductor substrate 114 includes a base semiconductor substrate 102, a nucleation layer 104, a buffer layer 106 (or "first semiconductor layer"), a channel layer 108 (or "second semiconductor layer"), a barrier layer 110, and a cap layer 112. In an embodiment, the base semiconductor substrate 102 includes a silicon substrate. In a more particular embodiment, the base semiconductor substrate 102 includes a high-resistivity, not-intentionally-doped (NID), silicon substrate with a <1 1 1> crystal lattice orientation. For example, the base semiconductor substrate 102 could be float zone silicon, CZ (Czochralski) silicon, or another silicon substrate variant. According to an embodiment, the base semiconductor substrate 102 is a high-resistivity substrate with a bulk resistivity in a range of about 500 ohms-centimeter (ohms-cm) to about 100,000 ohms-cm. In a more particular embodiment, the base semiconductor substrate 102 has a bulk resistivity in a range of about 1000 ohms-cm to about 10,000 ohms-cm. In other embodiments, the base semiconductor substrate 102 may include other materials such as silicon carbide (SiC), sapphire, silicon (Si), GaN, aluminum nitride (AlN), diamond, poly-SiC, GaN on silicon, silicon on insulator, gallium arsenide (GaAs), indium phosphide (InP), composites of the above, and other substantially insulating or high-resistivity materials.

As will be described in more detail below, in an embodiment, one or more ion species are implanted into the base semiconductor substrate 102 to form a doped region 180 at the surface 103 of the base semiconductor substrate 102. In various embodiments, doped region 180 may be formed by intentionally disrupting the crystal lattice and/or introducing compensating dopants through an ion implantation process used to form the doped region 180. More specifically, the one or more ion species within the doped region 180 include one or more ion species that may significantly disrupt the crystal lattice and/or introduce compensating dopants during an implantation process, resulting in a significant increase in the resistivity of the crystal lattice in the doped region 180. In other embodiments, an inert gas species, such as argon gas, may be used to disrupt the crystal lattice in order to significantly increase the resistivity of the crystal lattice at the surface of the base semiconductor substrate 102. In such an embodiment, significant doping may not be present in region 180.

According to various embodiments, the one or more ion species are selected from phosphorus, arsenic, antimony, bismuth, argon, nitrogen, and oxygen. Other suitable ion species may be used, as well (e.g., other species that introduce compensating dopants and/or sufficiently disrupt the crystal lattice to provide significantly higher resistivity in the doped region 180). Further, the dopant concentration of the one or more ion species within the doped region 180 may be between about $10^{15}$ cm$^{-3}$ and about $10^{19}$ cm$^{-3}$ in some embodiments and may be between about $5 \times 10^{15}$ cm$^{-3}$ and about $1 \times 10^{18}$ cm$^{-3}$ in other embodiments, though other higher or lower concentrations may be used. Methods for forming the doped region 180 will be discussed in more detail below.

All or portions of the doped region 180 corresponds to a diffusion barrier region and/or an enhanced resistivity region. Doped region 180 may be considered a "diffusion barrier region" when it has the effect of significantly reducing diffusion of various substances (e.g., gallium, aluminum, and so on) through the doped region 180 and into the base semiconductor substrate 102 during growth of the epitaxial material on the base semiconductor substrate 102, when compared with diffusion of such substances into the base semiconductor substrate 102 in the absence of doped region 180. Doped region 180 may be considered an "enhanced resistivity region" when it is characterized by a significantly higher electrical resistivity than the electrical resistivity of portions of the base semiconductor substrate 102 outside of (e.g., below) the doped region 180. In terms of electrical resistivity, "significantly higher" is defined herein to mean at least twice the magnitude, in an embodiment, at least 10 times the magnitude, in another embodiment, or at least 100 times the magnitude, in yet another embodiment. In still other embodiments, "significantly higher" means at least 1000 times the magnitude. For example, whereas the electrical resistivity of the base semiconductor substrate 102 outside of the doped region 180 may be in a range of about 500 ohms-cm to about 100,000 ohms-cm, as discussed above, the electrical resistivity of the doped region 180 may be within a range of about $10^5$ ohm-cm to about $10^{10}$ ohm-cm. The electrical resistivity of the doped region 180 may be lower or higher, as well.

In an embodiment, the doped region 180 has an upper boundary that substantially coincides with the upper surface 103 of the base semiconductor substrate 102, although the upper boundary may be below the upper surface 103 of the base semiconductor substrate 102, as well. The doped region 180 also has a lower boundary 190 that is located between the upper and lower surfaces 103, 101 of the base semiconductor substrate 102, and more particularly a distance (or depth) below the upper surface 103 of the base semiconductor substrate 102, in an embodiment. For example, the lower boundary 190 of the doped region 180 may be in a range of about 500 angstroms (0.05 microns) to about 100,000 angstroms (10 microns) below the upper surface 103 of the base semiconductor substrate 102, or in a range of about 1000 angstroms (0.1 microns) to about 30,000 angstroms (3.0 microns) below the upper surface 103 of the base semiconductor substrate 102, although the lower boundary 190 may be located at a shallower or deeper distance below the upper surface 103 of the base semiconductor substrate 102, as well.

The nucleation layer 104 is formed on or over the upper surface 103 of the base semiconductor substrate 102 and the doped region 180, in an embodiment. As used herein, a "heteroepitaxial layer" includes an epitaxial layer formed on a non lattice-matched substrate or any subsequent layer formed epitaxially over that epitaxial layer thereafter. An embodiment of the nucleation layer 104 includes a heteroepitaxial layer formed from a material selected from AlN, GaN, aluminum gallium nitride (AlGaN), indium aluminum nitride (InAlN), indium gallium nitride (InGaN), or other suitable materials. The nucleation layer 104 starts at the upper surface 103 of the base semiconductor substrate 102 and has a thickness in a range of about 100 angstroms to about 2000 angstroms.

The buffer layer 106 is formed on or over the upper surface 105 of the nucleation layer 104. According to an embodiment, the buffer layer 106 may include one or more group III-N semiconductor layers. More specifically, each of the one or more semiconductor layers of the buffer layer 106 may include an epitaxially grown group III-nitride epitaxial layer. The group-III nitride epitaxially layers that make up the buffer layer 106 may be nitrogen (N)-face or gallium (Ga)-face material, for example. In still other embodiments, the semiconductor layers of the buffer layer 106 may include Si, GaAs, InP, or other suitable materials.

In an embodiment, the buffer layer 106 is grown epitaxially on the nucleation layer 104. The buffer layer 106 may include at least one AlGaN mixed crystal layer. The total thickness of the buffer layer 106 (including all of its constituent layers) may be between about 200 angstroms and about 5,000 angstroms, although the buffer layer 106 may be thinner or thicker, as well.

Each of the at least one AlGaN mixed crystal layers of the buffer layer 106 may have a composition denoted by $Al_XGa_{1-X}N$ with an aluminum mole fraction, X, that can take on values between 0 and 1. A limiting X value of 0 yields pure GaN while a value of 1 yields pure aluminum nitride (AlN). In an embodiment, the $Al_XGa_{1-X}N$ layer(s) may be configured as GaN (X=0) where the $Al_XGa_{1-X}N$ is not intentionally doped (NID). The $Al_XGa_{1-X}N$ layer(s) may also be configured as one or more GaN layers where the one or more GaN layers are intentionally doped with dopants that may include Si, germanium (Ge), iron (Fe), chromium (Cr), carbon (C), magnesium (Mg) or other suitable dopants to render the buffer layer 106 substantially insulating or high resistivity. The dopant concentration may be between about $10^{17}$ cm$^{-3}$ and about $10^{19}$ cm$^{-3}$ although other higher or lower concentrations may be used. In one alternate embodiment, the $Al_XGa_{1-X}N$ layer(s) may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In a further alternate embodiment, the $Al_XGa_{1-X}N$ layer(s) may be configured with X=0.10 to 0.30 where the $Al_XGa_{1-X}N$ is NID or, alternatively, where the $Al_XGa_{1-X}N$ is intentionally doped with Fe, Cr, C, or other suitable dopant species. In still other embodiments, the $Al_XGa_{1-X}N$ layers may be configured as a superlattice where the additional layers include a series of alternating NID or doped $Al_XGa_{1-X}N$ layers where the value of X takes a value between 0 and 1. In some embodiments, the $Al_XGa_{1-X}N$ layers and/or superlattice layers may function as stress-relief layers, designed to minimize stress and wafer bow as a result of the growth of GaN on, for example, Si substrates. In still other embodiments, the buffer layer 106 may also or alternatively include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms although other thicknesses may be used.

In an embodiment, a channel layer 108 is formed on or over the upper surface 107 of the buffer layer 106. The channel layer 108 may include one or more group III-N semiconductor layers. The channel layer 108 may include an $Al_XGa_{1-X}N$ layer where X takes on values between 0 and 1. In an embodiment, the channel layer 108 is configured as GaN (X=0) although other values of X may be used. The thickness of the channel layer 108 may be between about 100 angstroms and about 10.0 microns, or between about 1000 angstroms to about 5000 angstroms, or between about 1000 angstroms to about 1.0 microns, although other thicknesses alternatively may be used. The channel layer 108 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used. In other embodiments, the channel layer may include NID or doped $In_YGa_{1-Y}N$, where Y, the indium mole fraction, may take a value between 0 and 1.

A barrier layer 110 is formed on or over the channel layer 108 in accordance with an embodiment. The barrier layer 110 may include one or more group III-N semiconductor layers. In some embodiments, the barrier layer 110 has a larger bandgap and larger spontaneous polarization than the channel layer 108 and, when the barrier layer 110 is in direct contact with the channel layer 108, a channel 109 is created in the form of a two-dimensional electron gas (2-DEG) within the channel layer 108 near the interface between the channel layer 108 and the barrier layer 110. In addition, strain between the barrier layer 110 and channel layer 108 may cause additional piezoelectric charge to be introduced into the 2-DEG and channel. The barrier layer 110 may include at least one NID $Al_XGa_{1-X}N$ layer where X takes on values between 0 and 1. In some embodiments, X may take a value of 0.1 to 0.35, although other values of X may be used. The thickness of the barrier layer 110 may be between about 20 angstroms and about 1000 angstroms although other thicknesses may be used. The barrier layer 110 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$, although other higher or lower concentrations may be used. In addition, there may be an additional AlN interbarrier layer (not shown) formed between the channel layer 108 and the barrier layer 110, in some embodiments. The AlN interbarrier layer may increase the channel charge and improve the electron confinement of the resultant 2-DEG. In other embodiments, the barrier layer 110 may include indium aluminum nitride (InAlN) layers, denoted $In_YAl_{1-Y}N$, where Y, the indium mole fraction, may take a value between about 0.1 and about 0.2 although other values of Y may be used. In the case of an InAlN barrier, the thickness of the barrier layer 110 may be between about 20 angstroms and about 2000 angstroms, although other thicknesses may be used. In the case of using InAlN to form the barrier layer 110, the InAlN may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

In the embodiment illustrated in FIG. 1, a cap layer 112 may be formed on or over the barrier layer 110. The cap layer 112 presents a stable surface for the semiconductor substrate 114 and serves to protect the surface of the semiconductor substrate 114 from chemical and environmental exposure incidental to wafer processing. The cap layer 112 may include one or more group III-N semiconductor layers. In an embodiment, the cap layer 112 is GaN. The thickness of the cap layer 112 may be between about 5 angstroms and about 100 angstroms, although other thicknesses may be used. The cap layer 112 may be NID or, alternatively, may include Si, Ge, C, Fe, Cr, Mg, or other suitable dopants. The dopant concentration may be between about $10^{16}$ cm$^{-3}$ and about $10^{19}$ cm$^{-3}$ although other higher or lower concentrations may be used.

Without departing from the scope of the inventive subject matter, it should be appreciated that the choice of materials and arrangement of layers to form semiconductor substrate 114 is exemplary. The inclusion of the base semiconductor substrate 102, a nucleation layer 104, a buffer layer 106, a channel layer 108, a barrier layer 110, and a cap layer 112 in the semiconductor substrate 114 is exemplary and the functions and operations of the various layers may be combined and may change depending on the materials used in any specific embodiment. In other embodiments using N-polar materials (not shown), the channel layer 108 may be disposed over the barrier layer 110 to create a 2-DEG and channel directly underneath an optional cap 112 and gate electrode 140. Still further embodiments may include semiconductor layers formed from materials including GaAs, aluminum gallium arsenide (AlGaAs), indium gallium arsenide (InGaAs), and aluminum indium arsenide (AlInAs) to form the semiconductor substrate 114.

One or more isolation regions 120 may be formed in the semiconductor substrate 114 to define an active region 130 along upper surface of the semiconductor substrate 114, according to an embodiment. The isolation regions 120 may be formed via an implantation procedure configured to damage the epitaxial and/or other semiconductor layers to create high resistivity regions 122 of the semiconductor substrate 114, rendering the semiconductor substrate 114 high resistivity or semi-insulating in those high resistivity regions 122 while leaving the crystal structure of layers 104, 106, 108, 110, and 112 intact in the active region 130. For example, isolation regions 120 may be formed by implanting an ion species at an energy sufficient to drive the species through cap layer 112, barrier layer 110, channel layer 108, and buffer layer 106 thus damaging the crystal lattice for these layers, disrupting the channel 109 within the isolation regions 120, and creating high resistivity regions 122 within the semiconductor substrate 114. In other embodiments, the isolation regions 120 may be formed by removing one or more of the epitaxial and/or other semiconductor layers of the semiconductor substrate 114, rendering the remaining layers of the semiconductor substrate 114 semi-insulating and leaving behind active region 130 "mesas" surrounded by high resistivity or semi-insulating isolation regions 120.

In an embodiment, a first dielectric layer 124 may be formed over the active region 130 and isolation regions 120. For example, the first dielectric layer 124 may include one of $Si_3N_4$, silicon dioxide ($SiO_2$), silicon oxynitride (SiON), $Al_2O_3$, hafnium dioxide ($HfO_2$), a combination of these, or other suitable insulating dielectric layers.

In an embodiment, an opening is made in the first dielectric layer 124, and a gate electrode 140 is formed over the semiconductor substrate 114 in the active region 130. The gate electrode 140 is electrically coupled to the channel 109 through the cap layer 112 and barrier layer 110. Changes to the electric potential on the gate electrode 140 shifts the quasi Fermi level for the barrier layer 110 compared to the quasi Fermi level for the channel layer 108, and thereby modulates the electron concentration in the channel 109 within the portion of the semiconductor substrate 114 under the gate electrode 140. The gate electrode 140 may be configured as a Schottky gate, for example, and may be formed over and directly in contact with the cap layer 112 of the semiconductor substrate 114 using a Schottky material layer and a conductive metal layer. A conductive low stress metal may be deposited over the Schottky material layer to form gate electrode 140, in an embodiment. The gate electrode 140 may be T-shaped with a vertical stem, as shown, or may be a square shape in other embodiments. In still other embodiments, the gate electrode 140 may be recessed through the cap layer 112 and extend partially into the barrier layer 110, thus increasing the electrical coupling of the gate electrode 140 to the channel 109 through the remaining thickness of the barrier layer 110. In other embodiments, the gate electrode 140 may be formed over a gate dielectric or gate oxide forming a metal-insulator-semiconductor (MIS) junction or metal oxide semiconductor (MOS) junction, thus electrically coupling the gate electrode 140 to the channel 109 through the dielectric or oxide layer.

In an embodiment, a first current carrying contact 150 (e.g., a source or a drain contact) may be formed over and in contact with the semiconductor substrate 114 adjacent the gate electrode 140 in the active region 130. In an embodiment, the first current carrying contact 150 may form an ohmic electrode with an ohmic junction to the channel 109. The first current carrying contact 150 may be formed over and in contact with the cap layer 112. In other embodiments, the first current carrying contact 150 may be recessed through the cap layer 112 and may extend partially through the barrier layer 110. In still other embodiments, ion implantation may be used to form ohmic contact to the channel 109.

In an embodiment, a second current carrying contact 160 (e.g., a drain or a source contact) may be formed over and in contact with the semiconductor substrate 114 adjacent the gate electrode 140 in the active region 130. The second current carrying contact 160 may form a Schottky junction with the channel 109, thus acting as a Schottky diode incorporated into the second current carrying contact 160. In an embodiment, the second current carrying contact 160 may be formed over and in contact with the cap layer 112. In other embodiments, the second current carrying contact 160 may be recessed through the cap layer 112 and extend partially through the barrier layer 110 to form a Schottky junction.

In an embodiment, metal electrodes (not shown) may be formed on or over the first and second current carrying contacts 150, 160 in the active region 130. In addition, one or more additional dielectric layers (not shown) may be formed over the metal electrodes, the gate electrode 140, the first and second current carrying contact 150, 160, and the first dielectric layer 124 in the isolation regions 120 and the active region 130. The additional dielectric layer(s) encapsulate the active region 130 and the isolation regions 120, protecting the surface from moisture and other contaminants. Additional metal electrodes, dielectric layers, and patterned metal layers also may be formed to provide desired electrical connectivity to the transistor device within the active region 130.

In the device of FIG. 1, the doped region 180 may reduce or prevent diffusion of gallium, aluminum, and/or other materials into the base semiconductor substrate during various epitaxial growth processes, such as the epitaxial growth processes associated with forming layers 104, 106, 108, 110, 112. This, in turn, may result in a reduction in parasitic losses and improved RF performance for a III-N device, when compared with similar devices in which such doped regions are not present.

Figure 2:
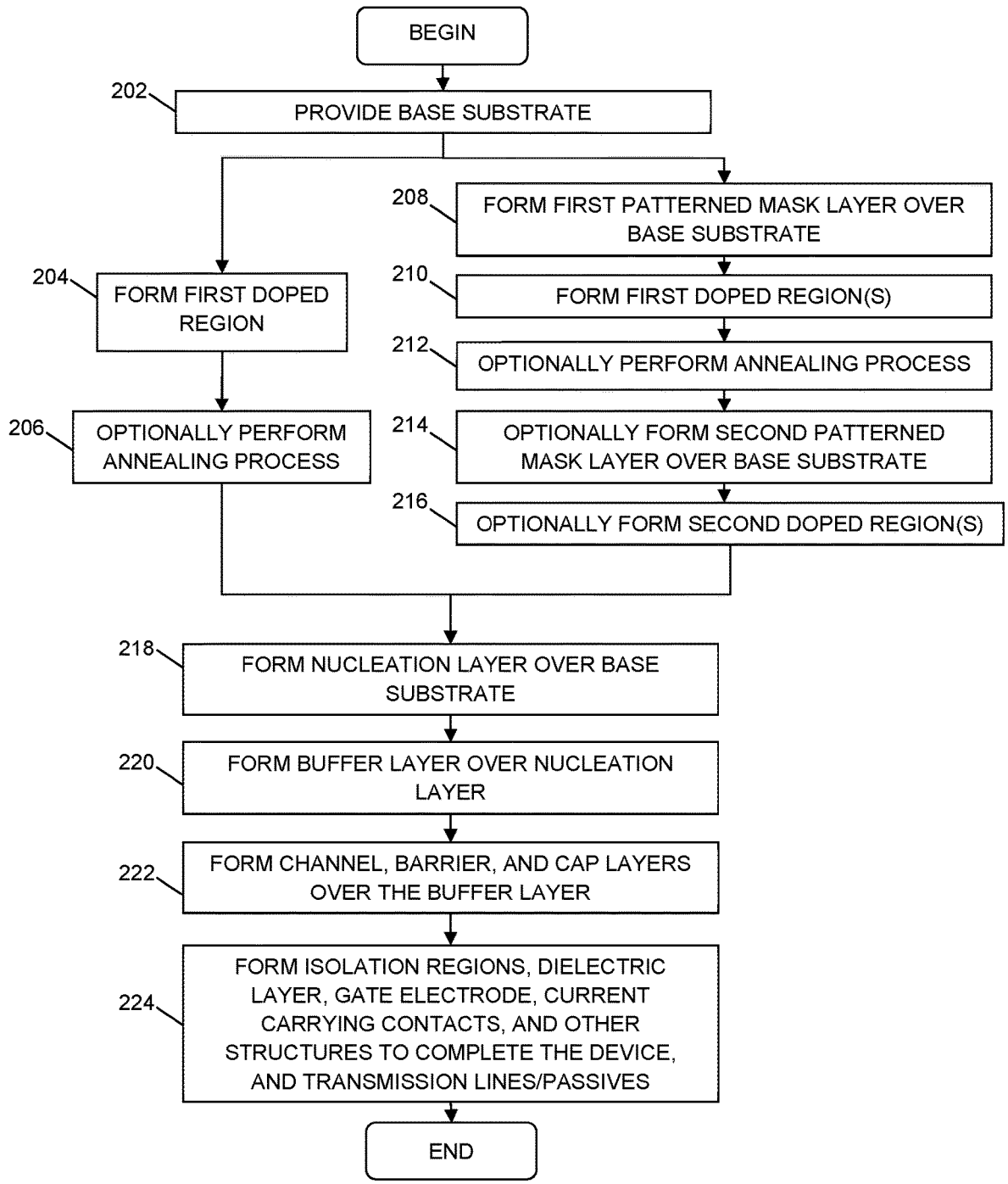
FIG. 2 is a flowchart of a method for fabricating a semiconductor device with a diffusion barrier, in accordance with an example embodiment.

Embodiments of methods for fabricating a semiconductor device (e.g., device 100) that includes one or more enhanced resistivity regions and/or diffusion barrier regions (e.g., region 180, 181, 182, 183, FIGS. 1, 5A, 5B, 5C) will now be described. More specifically, FIG. 2 is a flowchart of a method for fabricating a semiconductor device with a doped region in or on a base semiconductor substrate, in accordance with an example embodiment, where the doped region is effective to reduce or prevent diffusion of various materials into the base semiconductor substrate during subsequent epitaxial growth processes. FIG. 2 should be viewed in conjunction with FIGS. 3-5, which illustrate cross-sectional, side views of a series of fabrication steps for producing the semiconductor devices of FIGS. 1, 5A, 5B, and 5C, in accordance with various example embodiments. It should be noted that FIGS. 3A, 4A, and 5A correspond to a first embodiment of a method for fabricating a first device 100 (FIGS. 1, 5A), FIGS. 3B, 4B, and 5B correspond to a second embodiment of a method for fabricating a second device 200 (FIG. 5B), and FIGS. 3C, 3D, 4C, and 5C correspond to a third embodiment of a method for fabricating a third device 300 (FIG. 5C).

Referring both to FIG. 2 and FIGS. 3A, 3B, 3C, and 3D, the method may begin, in block 202, by providing a base semiconductor substrate 102. As discussed previously, the base semiconductor substrate 102 includes a high-resistivity, NID silicon substrate with a <1 1 1> crystal lattice orientation and a bulk resistivity in a range of about 500 ohms-cm to about 100,000 ohms-cm, in an embodiment. Alternatively, the base semiconductor substrate 102 may include other materials such as sapphire, SiC, GaN, AlN, diamond, poly-SiC, GaN on silicon, silicon on insulator, GaAs, InP, composites of the above, or other substantially insulating or high resistivity materials.

In a first embodiment, and referring both to FIG. 2 and to FIG. 3A, the method continues, in block 204, by forming a first doped region 180 at and below the upper surface 103 of the base semiconductor substrate 102. According to an embodiment, the first doped region 180 is formed by introducing ions (indicated by arrows 310) of one or more suitable species into the upper surface 103 of the base semiconductor substrate 102.

In one embodiment, the ions may be introduced by performing an ion implantation process. For example, the ion implantation process may be performed using an implant energy and acceleration voltage that are sufficient to ensure penetration of the ions into the base semiconductor substrate 102 to a desired depth (e.g., to depth 390). For example, the acceleration voltage used to implant the ions may be in a range of about 10 kilovolts to about 500 kilovolts, although lower or higher acceleration voltages alternatively may be used. In other embodiments, the base semiconductor substrate 102 may be placed in a diffusion furnace, and the ions may be implanted using a solid diffusion process or a gas phase diffusion process.

According to one embodiment, the ion species introduced into the base semiconductor substrate 102 are intended to create a diffusion barrier in the upper portion of the base semiconductor substrate 102 by introducing compensating dopants (i.e., dopants of an opposite type to the materials that the diffusion barrier is intended to restrict from diffusing into the base semiconductor substrate 102). Selection of such ions results in a first doped region 180 that corresponds to a diffusion barrier region in the upper portion of the base semiconductor substrate 102, in an embodiment. For example, the one or more ion species may include n-type ion species, in an embodiment, which are selected to compensate p-type auto doping (e.g., of gallium, aluminum, or other substances) that may occur during subsequent epitaxial growth processes (e.g., in conjunction with blocks 218, 220, and 222). In various embodiments, the one or more ion species intentionally introduced into doped region 180 are selected from phosphorus, arsenic, antimony, and bismuth. Other suitable ion species may be used, as well. Further, the dopant concentration of the one or more ion species introduced into the doped region 180 may be between about $10^{15}$ cm$^{-3}$ and about $10^{19}$ cm$^{-3}$ in some embodiments, or between about $5\times10^{15}$ cm$^{-3}$ and about $1\times10^{18}$ cm$^{-3}$ in other embodiments, although other higher or lower concentrations may be used.

According to another embodiment, the ion species introduced into the base semiconductor substrate 102 is intended to enhance the resistivity of the upper portion of the base semiconductor substrate 102 by disrupting the crystal lattice as a result of the implantation process. Selection of such ions results in a first doped region 180 that corresponds to an enhanced resistivity region in the upper portion of the base semiconductor substrate 102, in an embodiment. To produce the enhanced resistivity region, the one or more ion species include ions that are suitable to impart significant damage to the crystal lattice structure of the base semiconductor substrate 102, in an embodiment. In various embodiments, the one or more ion species within the doped region 180 are selected from argon, helium, and nitrogen. Other suitable ion species may be used, as well. Further, the dopant concentration of the one or more ion species within the doped region 180 may be between about $10^{15}$ cm$^{-3}$ and about $10^{19}$ cm$^{-3}$ in some embodiments, or between about $5\times10^{15}$ cm$^{-3}$ and about $1\times10^{18}$ cm$^{-3}$ in other embodiments, although other higher or lower concentrations may be used.

As will be discussed in more detail later, generating a doped region 180 that functions as an enhanced resistivity region increases the quality factor (Q) of the portion of the base semiconductor substrate 102 that includes the doped region 180. In other words, forming the doped region 180 using ion species that render the doped region 180 more resistive than the remainder of the base semiconductor substrate 102 essentially makes the base semiconductor substrate 102 a high-resistivity substrate. The high resistivity of the portions of the base semiconductor substrate 102 that include the more resistive doped region(s) 180 may, in turn, increase the Q of any transmission lines, electrical interconnects, passive devices (e.g., integrated capacitors, integrated spiral inductors, and so on), or other conductive features that are formed over the more resistive doped region(s) 180. Such transmission lines and passive devices are represented simply, for example, as conductive element 510, FIGS. 5C, 5D, 5E.

According to yet another embodiment, other types of ion species may be introduced into the base semiconductor substrate 102 to disrupt the crystal lattice, and subsequent processes may be performed to transform the upper portion of the base semiconductor substrate 102 into a highly-resistive material (e.g., silicon dioxide, $Si_xO_{2-x}$). For example, in one embodiment, oxygen may be introduced into the upper portion of the base semiconductor substrate 102 using ion implantation, solid diffusion, or gaseous diffusion process, and a subsequent high-temperature annealing process may be performed, in block 206, to convert the upper portion of the base semiconductor substrate 102 into a doped region 180 that comprises a highly resistive $Si_xO_{2-x}$ layer. The term "doped region," as used herein, is intended to include both doped regions that include intentionally-introduced dopants that have not been chemically converted through an annealing process, as well as highly resistive $Si_xO_{2-x}$ layers formed using the above described process. Prior to conversion of the upper portion of the base semiconductor substrate 102 into an $Si_xO_{2-x}$ layer (e.g., after block 204 but before block 214), the dopant concentration of the oxygen within the doped region 180 may be between about $10^{15}$ cm$^{-3}$ and about $10^{19}$ cm$^{-3}$ in some embodiments, or between about $5\times10^{15}$ cm$^{-3}$ and about $1\times10^{18}$ cm$^{-3}$ in other embodiments, although other higher or lower concentrations may be used.

Again, a doped region 180 comprising an $Si_xO_{2-x}$ layer may be significantly more resistive than the remainder of the base semiconductor substrate 102, which essentially makes the base semiconductor substrate 102 a high-resistivity substrate. The high resistivity of the portions of the base semiconductor substrate 102 that include the more resistive doped region(s) 180 may, in turn, increase the Q of any transmission lines, passive devices, or other conductive features (e.g., conductive element 510, FIGS. 5C, 5C, 5E) that are formed over the more resistive doped region(s) 180 comprising an $Si_xO_{2-x}$ layer.

In whichever way it is formed, the doped region 180 has a lower boundary 190 that is located a distance 390 below the upper surface 103 of the base semiconductor substrate 102. For example, the lower boundary 190 of the doped region 180 may be in a range of about 500 angstroms (0.05 microns) to about 100,000 angstroms (10 microns) below the upper surface 103 of the base semiconductor substrate 102, or in a range of about 1000 angstroms (0.1 microns) to about 30,000 angstroms (3.0 microns) below the upper surface 103, although the lower boundary 190 may be located at a shallower or deeper distance below the upper surface 103 of the base semiconductor substrate 102, as well.

Figure 3A:
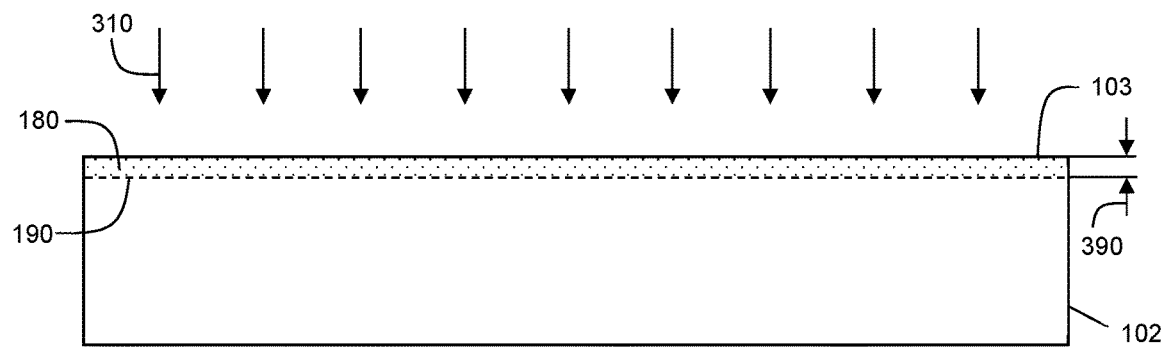
FIGS. 3A, 4A, and 5A illustrate cross-sectional, side views of a series of fabrication steps for producing the semiconductor device of FIG. 1, in accordance with an example embodiment.

The doped region 180 shown in FIG. 3A and formed using the aforementioned methods results in a doped region 180 integrally formed within the base semiconductor substrate 102, and which extends from the upper surface 103 of the base semiconductor substrate 102 to a lower boundary 190. In an alternate embodiment, and referring both to FIG. 2 and to FIG. 3B, the process in block 204 of forming a first doped region, in this case doped region 181, includes forming a doped semiconductor layer 380 on and above the upper surface 103 of the base semiconductor substrate 102, where the doped semiconductor layer 380 is or includes the first doped region 181.

According to an embodiment, the semiconductor layer 380, with upper surface 105, includes a heteroepitaxial layer formed from silicon (i.e., an epitaxially-grown silicon layer), or a heteroepitaxial layer formed from other suitable semiconductor materials. The semiconductor layer 380 has a thickness 391 in a range of about 500 angstroms (0.05 microns) to about 100,000 angstroms (10 microns), or in a range of about 1000 angstroms (0.1 microns) to about 30,000 angstroms (3.0 microns), although the thickness 391 may be smaller or larger, as well. The semiconductor layer 380 may be grown on or over the upper surface 103 of base semiconductor substrate 102 using one of metalorganic chemical vapor deposition (MOCVD), molecular beam epitaxy (MBE), hydride-vapor phase epitaxy (HVPE) or a combination of these techniques, although other suitable techniques alternatively may be used. One or more ion species may be introduced into the semiconductor layer 380 during the epitaxial growth process (e.g., using in situ doping), in one embodiment. Alternatively, an implant process similar to one of the processes described in conjunction with FIG. 3A may be performed after NID semiconductor material is grown on the upper surface 103 of the base semiconductor substrate 102, in other embodiments.

The one or more ion species within the doped region 181 include one or more n-type ion species, in an embodiment, which are selected to compensate the p-type auto doping (e.g., of gallium, aluminum, or other substances) that may occur during subsequent epitaxial growth processes (e.g., in conjunction with blocks 218, 220, and 222). Again, in various embodiments, the one or more ion species within the doped region 181 may be selected from phosphorus, arsenic, antimony, and bismuth. Other suitable ion species may be used, as well. Further, the dopant concentration of the one or more ion species within the doped region 181 may be between about $10^{15}$ cm$^{-3}$ and about $10^{19}$ cm$^{-3}$ in some embodiments, or between about $5 \times 10^{15}$ cm$^{-3}$ and about $1 \times 10^{18}$ cm$^{-3}$ in other embodiments, although other higher or lower concentrations may be used. This process results in a first doped region 181 that corresponds to a diffusion barrier region on the upper surface 103 of the base semiconductor substrate 102, in an embodiment.

In the above-described embodiments, a blanket doping and/or deposition process is used to form doped region 180, 181 (FIGS. 3A, 3B) in or on a base semiconductor substrate 102. In yet other embodiments, and referring to FIG. 2 and to FIGS. 3C and 3D, one or more selective doping processes are performed to form doped regions of one or more "types" in selected areas (e.g., areas 130, 132) of the base semiconductor substrate 102. In some embodiments, doped regions of a single type are formed in selected areas (e.g., areas 130 or 132) of the base semiconductor substrate 102, and doped regions in or on the upper portion of the base semiconductor substrate 102 are not formed in remaining areas of the base semiconductor substrate 102. In such an embodiment, the selective doped region formation process may include blocks 208, 210, and optionally block 212, which will be described below, and blocks 214 and 216 may be bypassed. In other embodiments, doped regions of two "different types" are formed in different selected areas (e.g., areas 130 and 132) of the base semiconductor substrate 102, in which case blocks 208, 210, 214, 216, and optionally block 212 each are performed, as will be described below. In still other embodiments, doped regions of more than two different types may be formed in different selected areas of the base semiconductor substrate 102, in which case some of the processes described in blocks 208-216 may be repeated. As used herein, doped regions of "different types" include regions formed using different ions or ion combinations, regions that include different ion concentrations, regions that have and have not been converted through an annealing process, and/or regions that have lower boundaries of different depths.

The selective doping processes may result in some areas of the upper portion of the base semiconductor substrate 102 being converted into enhanced resistivity regions, and/or other areas of the upper portion of the base semiconductor substrate 102 to be converted into diffusion barrier regions. The type of doped region formed in any particular area (e.g., areas 130, 132) of the upper portion of the base semiconductor substrate 102 is selected to enhance the operational performance of integrated electrical circuits or components formed over those areas, and/or to achieve other desired outcomes (e.g., more compact electrical structures, and so on). For example, as will be explained in more detail in conjunction with FIGS. 5C, 5D, and 5E, it may be desirable to form diffusion barrier regions in areas 130 of the base semiconductor substrate 102 that underlie active devices (e.g., transistor structures), and it may be desirable to form enhanced resistivity regions in areas 132 of the base semiconductor substrate 102 that underlie passive devices, transmission lines, electrical interconnects, and other structures for which high-Q characteristics are desired.

To form different types of doped regions in different areas of the base semiconductor substrate 102, blocks 204 and 206 of FIG. 2 are replaced with blocks 208-216. Referring first to block 208 and FIG. 3C, formation of one or more first doped regions 182 of a first type at and below the upper surface 103 of the base semiconductor substrate 102 includes a process of forming a first patterned mask layer 350 over the upper surface 103 of the base semiconductor substrate 102. Openings in the mask layer 350 expose portions of the upper surface 103, and in block 210, and first ions (indicated by arrows 311) of one or more suitable species are introduced into the upper surface 103 of the base semiconductor substrate 102.

For example, the first ions may be selected to enhance the resistivity of the upper portion of the base semiconductor substrate 102 by disrupting the crystal lattice as a result of the implantation process. As described above, for example, ions suitable to convert an upper portion of base semiconductor substrate 102 into an enhanced resistivity region include argon, helium, nitrogen, oxygen, and other suitable dopants. In other embodiments, the first ions may be selected to form a diffusion barrier region in the upper portion of the base semiconductor substrate 102 by introducing compensating dopants to the auto doping (e.g., of gallium, aluminum, or other substances) that may occur during subsequent epitaxial growth processes (e.g., in conjunction with blocks 218, 220, and 222). As described above, for example, ions suitable to convert an upper portion of base semiconductor substrate 102 into an enhanced resistivity region include phosphorus, arsenic, antimony, bismuth, and other suitable dopants.

In various embodiments, the first ions may be introduced into the base semiconductor substrate 102 using ion implantation, solid diffusion, or gaseous diffusion processes. For example, an ion implantation process may include implanting the first ions using an implant energy and acceleration voltage that are sufficient to ensure penetration of the ions into the base semiconductor substrate 102 to a desired depth. For example, the acceleration voltage used to implant the ions may be in a range of about 10 kilovolts to about 2500 kilovolts, although lower or higher acceleration voltages alternatively may be used. The dopant concentration of the first ions within the doped regions 182 may be between about $10^{15}$ cm$^{-3}$ and about $10^{19}$ cm$^{-3}$ in some embodiments, or between about $5\times10^{15}$ cm$^{-3}$ and about $1\times10^{18}$ cm$^{-3}$ in other embodiments, although other higher or lower concentrations may be used.

The first doped regions 182 have lower boundaries 192 that are located a distance 392 below the upper surface 103 of the base semiconductor substrate 102. For example, the lower boundary 192 of the doped regions 182 may be in a range of about 500 angstroms (0.05 microns) to about 100,000 angstroms (10 microns) below the upper surface 103 of the base semiconductor substrate 102, or in a range of about 1000 angstroms (0.1 microns) to about 30,000 angstroms (3.0 microns) below the upper surface 103, although the lower boundaries 192 may be located at a shallower or deeper distance below the upper surface 103 of the base semiconductor substrate 102, as well.

In an embodiment in which oxygen ions have been introduced into the upper portion of the base semiconductor substrate 102 and formation of an $Si_xO_{2-x}$ layer is desired, a subsequent high-temperature annealing process may be performed, in block 212, as described above, to convert the upper portion of the base semiconductor substrate 102 into a doped region 182 that comprises a highly resistive $Si_xO_{2-x}$ layer. In other embodiments, the annealing process is not performed.

After forming the first doped regions 182 and (optionally) performing an annealing process, the first patterned mask layer 350 is removed from the upper surface 103 of the base semiconductor substrate 102. When no additional doped regions are to be formed, the process may bypass blocks 214 and 216, and may proceed to block 218, which is described later. Alternatively, additional doped regions of a different type may be formed by performing the processes of blocks 214 and 216.

Figure 3B:
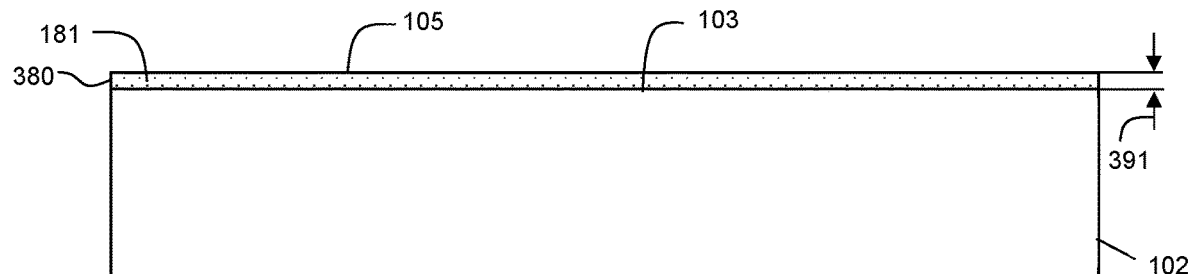
FIGS. 3B, 4B, and 5B illustrate cross-sectional, side views of a series of fabrication steps for producing a semiconductor device, in accordance with another example embodiment.
Figure 3C:
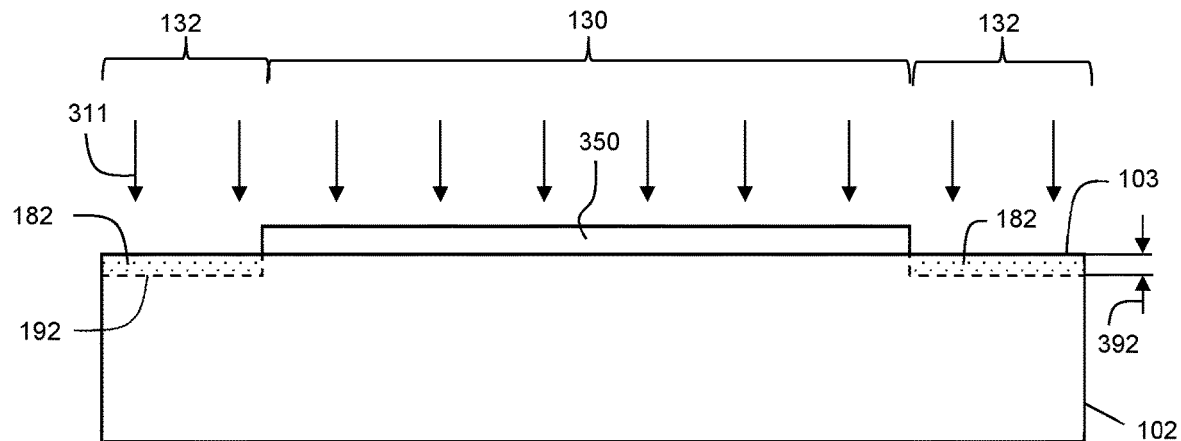
FIGS. 3C, 3D, 4C, and 5C illustrate cross-sectional, side views of a series of fabrication steps for producing a semiconductor device, in accordance with yet another example embodiment.
Figure 3D:
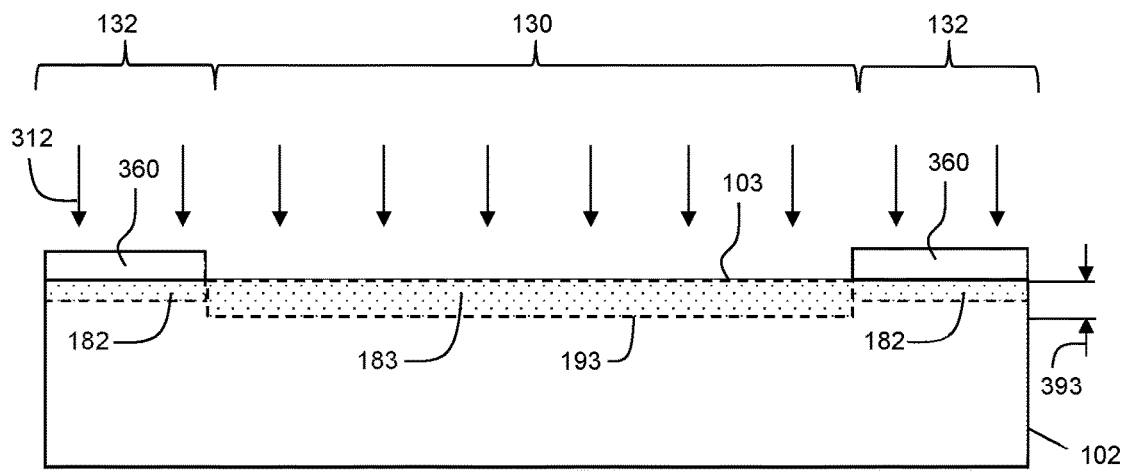

Referring now to FIG. 3D, performance of blocks 214 and 216 results in the formation of one or more second doped regions 183 of a second type at and below the upper surface 103 of the base semiconductor substrate 102. More specifically, block 214 includes a process of forming a second patterned mask layer 360 over the upper surface 103 of the base semiconductor substrate 102. The second pattern mask layer 360 may cover the previously-formed first doped regions 182, for example, and openings in the second mask layer 360 may expose other and different portions of the upper surface 103. In block 216, second ions (indicated by arrows 312) of one or more suitable species are introduced into the upper surface 103 of the base semiconductor substrate 102. The second ions 312 may be the same as the first ions 311, or may be different from the first ions 311, in various embodiments.

For example, the second ions may be selected to enhance the resistivity of the upper portion of the base semiconductor substrate 102 by disrupting the crystal lattice as a result of the implantation process. As described above, for example, ions suitable to convert an upper portion of base semiconductor substrate 102 into an enhanced resistivity region include argon, helium, nitrogen, oxygen, and other suitable dopants. In other embodiments, the second ions may be selected to form a diffusion barrier region in the upper portion of the base semiconductor substrate 102 by introducing compensating dopants to the auto doping (e.g., of gallium, aluminum, or other substances) that may occur during subsequent epitaxial growth processes (e.g., in conjunction with blocks 218, 220, and 222). As described above, for example, ions suitable to convert an upper portion of base semiconductor substrate 102 into an enhanced resistivity region include phosphorus, arsenic, antimony, bismuth, and other suitable dopants.

In various embodiments, the second ions may be introduced into the base semiconductor substrate 102 using ion implantation, solid diffusion, or gaseous diffusion processes. For example, an ion implantation process may include implanting the first ions using an implant energy and acceleration voltage that are sufficient to ensure penetration of the ions into the base semiconductor substrate 102 to a desired depth. For example, the acceleration voltage used to implant the ions may be in a range of about 10 kilovolts to about 500 kilovolts, although lower or higher acceleration voltages alternatively may be used. The dopant concentration of the second ions within the doped regions 183 may be between about $10^{15}$ cm$^{-3}$ and about $10^{19}$ cm$^{-3}$ in some embodiments, or between about $5\times10^{15}$ cm$^{-3}$ and about $1\times10^{18}$ cm$^{-3}$ in other embodiments, although other higher or lower concentrations may be used.

The second doped regions 183 have lower boundaries 193 that are located a distance 393 below the upper surface 103 of the base semiconductor substrate 102. For example, the lower boundary 193 of the doped regions 183 may be in a range of about 500 angstroms (0.05 microns) to about 100,000 angstroms (10 microns) below the upper surface 103 of the base semiconductor substrate 102, or in a range of about 1000 angstroms (0.1 microns) to about 30,000 angstroms (3.0 microns) below the upper surface 103, although the lower boundaries 193 may be located at a shallower or deeper distance below the upper surface 103 of the base semiconductor substrate 102, as well. In some embodiments, the distance 393 of the lower boundaries 193 may be greater than the distance 392 of the lower boundaries 192 of the first doped regions 182. In other words, the second doped regions 183 may extend to a deeper depth into the base semiconductor substrate 102 than the first doped regions 182, as shown in FIG. 3D. In other embodiments, the first and second doped regions 182, 183 may have substantially similar depths, or the first doped regions 182 may be deeper than the second doped regions 183.

Again, in an embodiment in which oxygen ions have been introduced into the upper portion of the base semiconductor substrate 102 and formation of an $Si_xO_{2-x}$ layer is desired, a subsequent high-temperature annealing process may be performed, as described above, to convert the upper portion of the base semiconductor substrate 102 into a doped region 183 that comprises a highly resistive $Si_xO_{2-x}$ layer. In other embodiments, the annealing process is not performed.

After forming the second doped regions 183 and (optionally) performing an annealing process, the second patterned mask layer 360 is removed from the upper surface 103 of the base semiconductor substrate 102. When no additional doped regions are to be formed, the process may proceed to block 218. Alternatively, additional doped regions of a different type may be formed by repeating the mask layer formation, doped region formation, and optional annealing processes described above.

Figure 4A:
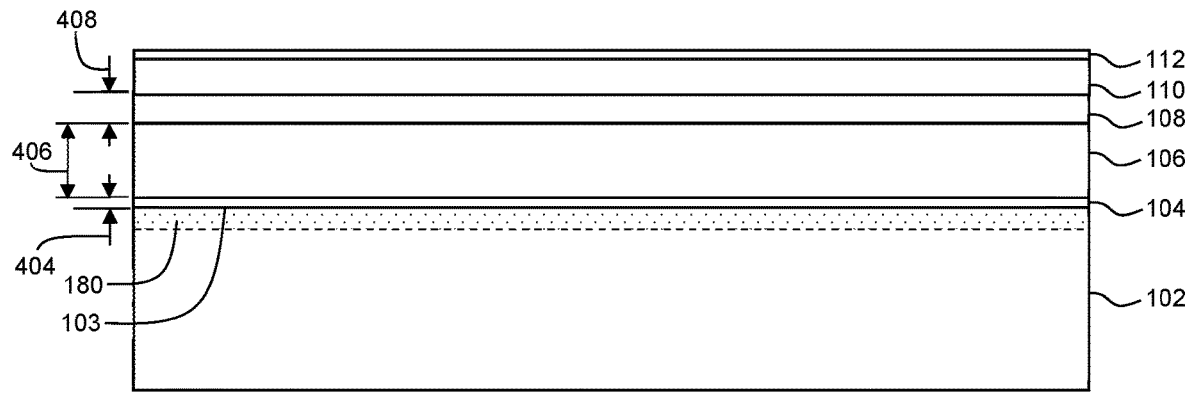
Figure 4B:
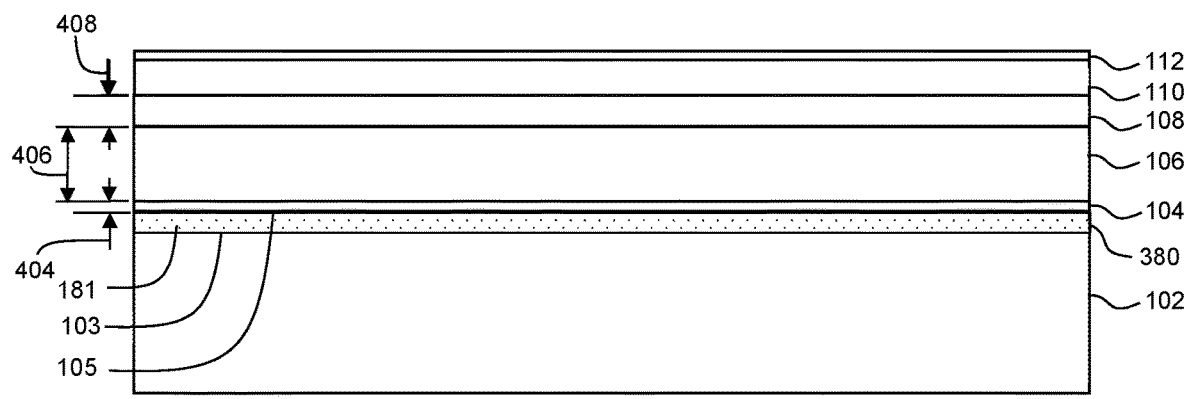
Figure 4C:
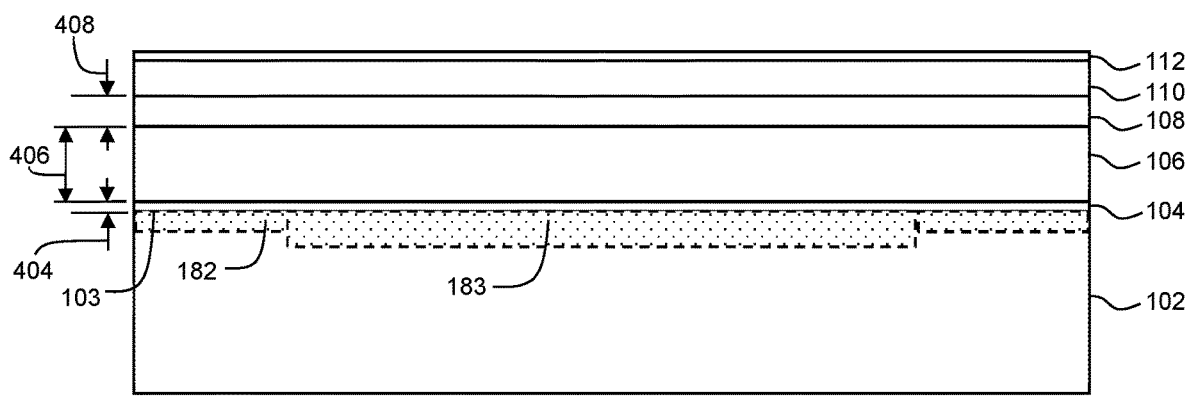
Figure 5A:
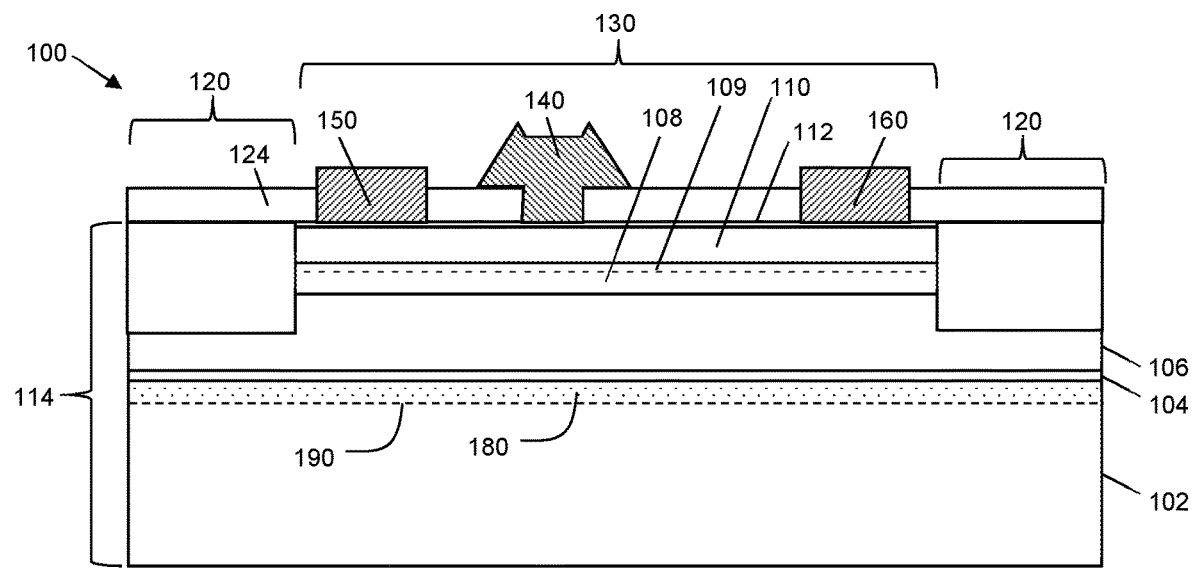

Referring now to FIGS. 4A, 4B, and 4C, in block 218, a nucleation layer 104 is formed on or over the doped region 180, 181, 182, and 183. In the embodiments of FIGS. 3A, 3C, and 3D in which the doped regions 180, 182, and 183 are formed in the base semiconductor substrate 102, the nucleation layer 104 is formed on the upper surface 103 of the base semiconductor substrate 102. Conversely, in the embodiment of FIG. 3B in which the doped region 181 includes a material layer formed on the upper surface 103 of the base semiconductor substrate 102, the nucleation layer 104 is formed on the surface of the material layer that comprises doped region 181. As discussed previously, an embodiment of the nucleation layer 104 includes a heteroepitaxial layer formed from a material selected from AlN, GaN, AlGaN, InAlN, InGaN, or other suitable materials. The nucleation layer 104 has a thickness 404 in a range of about 100 angstroms to about 2000 angstroms. The nucleation layer 104 may be grown on or over the upper surface 103 of base semiconductor substrate 102 using one of MOCVD, MBE, HVPE or a combination of these techniques, although other suitable techniques alternatively may be used.

In block 220, a buffer layer 106 (also referred to as a "first semiconductor layer") is formed on or over the upper surface of the nucleation layer 104. As discussed previously, and according to an embodiment, the buffer layer 106 may include one or more group III-N semiconductor layers, including an epitaxially grown group III-nitride epitaxial layer (e.g., nitrogen (N)-face or gallium (Ga)-face materials), or alternatively may include Si, GaAs, InP, or other suitable materials. The buffer layer 106 may include at least one AlGaN mixed crystal layer.

In an embodiment, the buffer layer 106 is grown epitaxially on the upper surface of the nucleation layer 104. The total thickness 406 of the buffer layer 106 may be between about 200 angstroms and about 30,000 angstroms, although other thicknesses may be used. The buffer layer 106 may be grown on or over the upper surface of the nucleation layer 104 using one of MOCVD, MBE, HVPE or a combination of these techniques, although other suitable techniques alternatively may be used.

In block 222, a channel layer 108 is formed on or over the upper surface of the buffer layer 106. As discussed previously, the channel layer 108 may include one or more group III-N semiconductor layers (e.g., including high quality NID GaN). The channel layer 108 may be grown on or over the upper surface of the buffer layer 106 using one of MOCVD, MBE, HVPE or a combination of these techniques, although other suitable techniques alternatively may be used. The thickness 408 of the channel layer 108 may be between about 100 angstroms and about 10.0 microns, or between about 1000 angstroms to about 5000 angstroms, or between about 1000 angstroms to about 1.0 microns, although other thicknesses alternatively may be used.

A barrier layer 110 is then formed on or over the channel layer 108 (resulting in the creation of a channel 109 in the form of a 2-DEG). As discussed previously, the barrier layer 110 may include one or more group III-N semiconductor layers (e.g., one or more NID $Al_xGa_{1-x}N$ layers). The barrier layer 110 may be grown on or over the upper surface of the channel layer 108 using one of MOCVD, MBE, HVPE or a combination of these techniques, although other suitable techniques alternatively may be used. The thickness of the barrier layer 110 may be between about 50 angstroms and about 1000 angstroms, although other thicknesses alternatively may be used. The barrier layer 110 may be NID or, alternatively, may include Si, Ge, C, Fe, Cr, Mg, or other suitable dopants. In addition, there may be an additional AlN interbarrier layer (not shown) formed between the channel layer 108 and the barrier layer 110, in some embodiments.

A cap layer 112 is then formed on or over the barrier layer 110. As discussed previously, the cap layer 112 may include one or more group III-N semiconductor layers (e.g., GaN). The cap layer 112 may be grown on or over the upper surface of the barrier layer 110 using one of MOCVD, MBE, HVPE or a combination of these techniques, although other suitable techniques alternatively may be used. The thickness of the cap layer 112 may be between about 5 angstroms and about 100 angstroms, although other thicknesses alternatively may be used. The cap layer 112 may be NID or, alternatively, may include Si, Ge, C, Fe, Cr, Mg, or other suitable dopants.

It may be desirable to prevent annealing or reversal of the aforementioned crystal lattice damage in the doped regions 180, 181, 182, and 183 of the base substrate 102. Such annealing of the crystal lattice damage may occur at a re-crystallization temperature that depends on the dopant species used, and may lead to reduced resistivity of the doped regions 180, 181, 182, and 183. Accordingly, in an embodiment, the growth temperature used to form the semiconductor layers of the semiconductor substrate 114 (e.g., nucleation layer 104, buffer layer 106, channel layer 108, barrier layer 110, and cap layer 112) may be selected to be below a re-crystallization temperature of the one or more first doped regions 180, 181, 182, and 183. For example, in some embodiments, the growth temperature used to form the semiconductor layers of the semiconductor substrate 114 may be between about 550 degrees Celsius and about 750 degrees Celsius. In other embodiments, the growth temperature may be between about 750 degrees Celsius and about 950 degrees Celsius. In still other embodiments, the growth temperature used to form the nucleation layer 104 may be between about 950 degrees Celsius and about 1200 degrees Celsius. Higher or lower growth temperatures may be used during the growth of the epitaxially grown semiconductor layers of the semiconductor substrate 114.

In block 224, further additional processes for completing the semiconductor device 100, 200, 300 (FIGS. 1, 5A, 5B, 5C) may include forming one or more isolation regions 120 to define an active region 130 along upper surface of the semiconductor substrate 114, forming a first dielectric layer 124 over at least the active region 130, forming a gate electrode 140, and forming first and second current carrying contacts 150, 160 (e.g., source and drain contacts). Additional metal electrodes, dielectric layers, and patterned metal layers (not illustrated) also may be formed to provide desired electrical connectivity to the transistor device within the active region 130. Conventional semiconductor processing techniques may be used to form the isolation regions 120, the first dielectric layer 124, the gate electrode 140, the current carrying contacts 150, 160, and the additional structures, and such techniques are not described in detail herein for the purpose of brevity.

Additional integrated electrical devices and structures also may be formed, in block 224. For example, the additional integrated electrical devices and structures may include additional transmission lines, electrical interconnects, passive devices (e.g., integrated capacitors, integrated spiral inductors, and so on), or other conductive features, which are represented simply, for example, as conductive element 510, FIGS. 5C, 5D, 5E., discussed below.

Variations of the above-described process embodiments result in the formation of a completed semiconductor device with one or more doped regions in or on the upper surface 103 of a base semiconductor substrate 102, where the one or more doped regions may include enhanced resistivity region(s) and/or diffusion barrier region(s). FIGS. 5A, 5B, 5C, 5D, and 5E illustrate various example embodiments of semiconductor devices 100, 200, 300, 400, 500 that may be fabricated using embodiments of the inventive subject matter.

FIG. 5A again illustrates a cross-sectional, side view of the semiconductor device 100 of FIG. 1, and the various details and embodiments discussed in conjunction with FIG. 1 will not be repeated here for brevity. As a brief summary, semiconductor device 100 includes a semiconductor substrate 114, isolation regions 120, and an active region 130 within which a transistor is formed. The transistor includes a gate electrode 140, first and second current carrying contacts 150, 160, and a channel 109. The semiconductor substrate 114 includes a base semiconductor substrate 102, a nucleation layer 104, a buffer layer 106, a channel layer 108, a barrier layer 110, and a cap layer 112. In an embodiment, the base semiconductor substrate 102 includes a high-resistivity, NID, silicon substrate with a <1 1 1> crystal lattice orientation.

One or more ion species are intentionally introduced into the base semiconductor substrate 102, as described in conjunction with FIG. 3A, to form a doped region 180 at and below the surface of the base semiconductor substrate 102. The doped region 180 has a lower boundary 190 between the upper and lower surfaces of the base semiconductor substrate 102. For example, the lower boundary 190 of the doped region 180 may be in a range of about 500 angstroms (0.05 microns) to about 100,000 angstroms (10 microns) below the upper surface of the base semiconductor substrate 102, or in a range of about 1000 angstroms (0.1 microns) to about 30,000 angstroms (3.0 microns) below the upper surface of the base semiconductor substrate 102, although the lower boundary 190 may be located at a shallower or deeper distance below the upper surface of the base semiconductor substrate 102, as well.

The one or more ion species introduced into the base semiconductor substrate 102 may include one or more of phosphorus, arsenic, antimony, bismuth, argon, helium, nitrogen, oxygen, or other suitable ion species. The dopant concentration of the one or more ion species within the doped region 180 may be between about $10^{15}$ cm$^{-3}$ and about $10^{19}$ cm$^{-3}$ in some embodiments and may be between about $5\times10^{15}$ cm$^{-3}$ and about $1\times10^{18}$ cm$^{-3}$ in other embodiments, though other higher or lower concentrations may be used. In an embodiment in which the ion species includes oxygen, an annealing process may be performed to convert the doped region 180 into an $Si_xO_{2-x}$ layer.

All or portions of the doped region 180 may correspond to a diffusion barrier region and/or an enhanced resistivity region, in various embodiments. According to a particular embodiment, portions of the doped region 180 located below the active region 130 of the device 100 more desirably correspond to a diffusion barrier region, which includes compensating dopant ions selected from phosphorus, arsenic, antimony, and bismuth. However, portions of the doped region 180 located below the active region 130 could correspond to an enhanced resistivity region, which includes compensating dopant ions selected from argon, helium, nitrogen, or oxygen, or an $Si_xO_{2-x}$ layer formed after introduction of oxygen ions into the doped region 180 and the performance of an annealing process (e.g., block 206, FIG. 2).

Figure 5B:
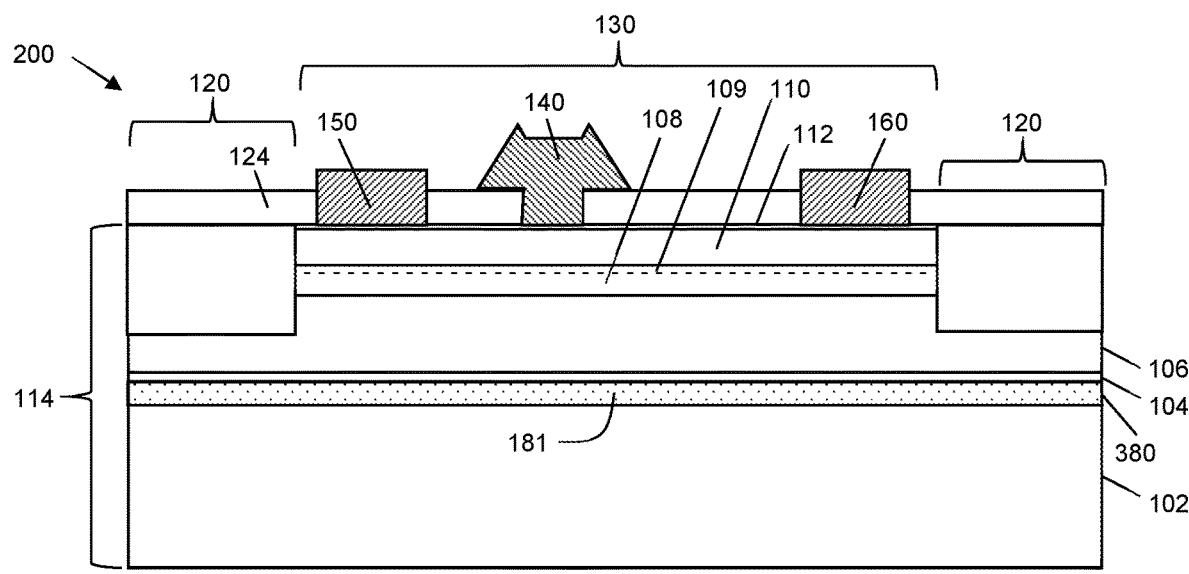
Figure 5C:
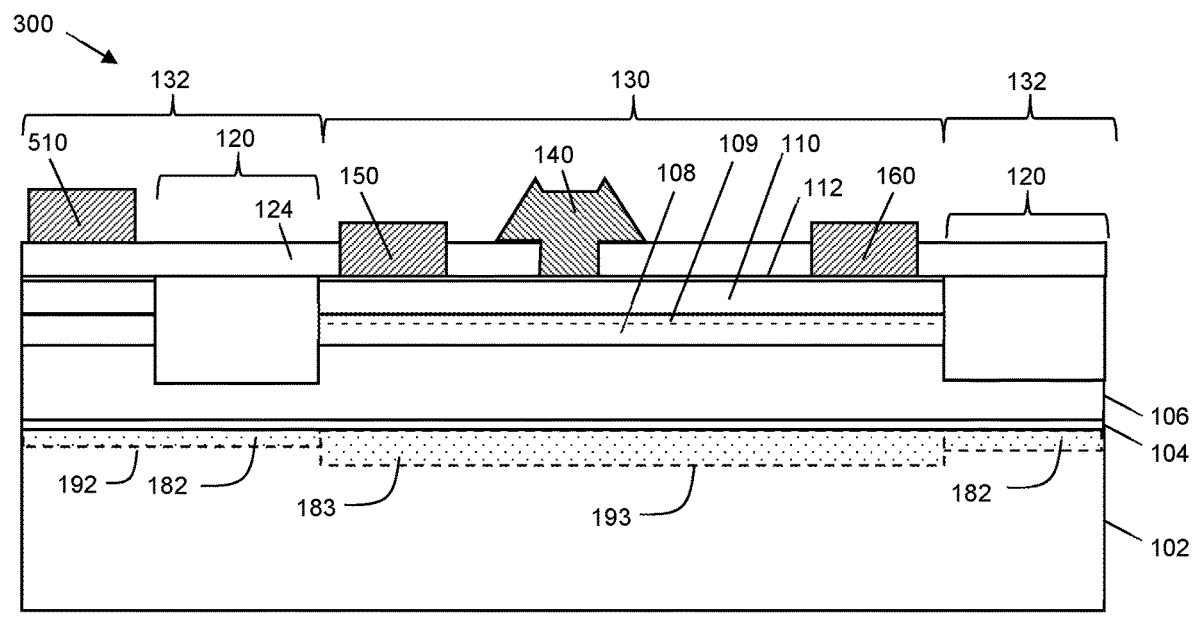

As indicated previously in conjunction with FIGS. 3B and 4B, and referring now to FIG. 5B, an alternate embodiment of a semiconductor device 200 includes a doped semiconductor layer (e.g., layer 380, FIG. 3B) on and above the upper surface of the base semiconductor substrate 102, where the doped semiconductor layer is or includes doped region 181.

Similar to the previously described semiconductor device 100 (FIGS. 1, 5A), semiconductor device 200 includes a semiconductor substrate 114, isolation regions 120, and an active region 130 within which a transistor is formed. The transistor includes a gate electrode 140, first and second current carrying contacts 150, 160, and a channel 109. The semiconductor substrate 114 includes a base semiconductor substrate 102, a nucleation layer 104, a buffer layer 106, a channel layer 108, a barrier layer 110, and a cap layer 112. In an embodiment, the base semiconductor substrate 102 includes a high-resistivity, NID, silicon substrate with a <1 1 1> crystal lattice orientation.

As described in conjunction with FIG. 3B, an epitaxially-grown semiconductor layer 380, which includes the doped region 181, is connected to the upper surface of the base semiconductor substrate 102. For example, the semiconductor layer 380 may be a heteroepitaxial layer formed from silicon, or a heteroepitaxial layer formed from other suitable semiconductor materials. The semiconductor layer 380 has a thickness (e.g., thickness 391, FIG. 3B) in a range of about 500 angstroms (0.05 microns) to about 100,000 angstroms (10 microns), or in a range of about 1000 angstroms (0.1 microns) to about 30,000 angstroms (3.0 microns), although the thickness may be smaller or larger, as well.

The one or more ion species intentionally included in the doped region 181 may include one or more of phosphorus, arsenic, antimony, bismuth, argon, helium, nitrogen, oxygen, or other suitable ion species. The dopant concentration of the one or more ion species within the doped region 181 may be between about $10^{15}$ cm$^{-3}$ and about $10^{19}$ cm$^{-3}$ in some embodiments and may be between about $5\times10^{15}$ cm$^{-3}$ and about $1\times10^{18}$ cm$^{-3}$ in other embodiments, though other higher or lower concentrations may be used. In an embodiment in which the ion species includes oxygen, an annealing process may be performed to convert the doped region 181 into an $Si_xO_{2-x}$ layer.

All or portions of the doped region 181 may correspond to a diffusion barrier region and/or an enhanced resistivity region, in various embodiments. According to a particular embodiment, portions of the doped region 181 located below the active region 130 of the device 200 more desirably correspond to a diffusion barrier region, which includes compensating dopant ions selected from phosphorus, arsenic, antimony, and bismuth. However, portions of the doped region 181 located below the active region 130 could correspond to an enhanced resistivity region, which includes compensating dopant ions selected from argon, helium, nitrogen, or oxygen, or an $Si_xO_{2-x}$ layer formed after inclusion of oxygen ions in the doped region 181 and the performance of an annealing process (e.g., block 206, FIG. 2).

As indicated previously in conjunction with FIGS. 3C, 3D, and 4C, and referring now to FIG. 5C, an alternate embodiment of a semiconductor device 300 includes multiple different types of doped regions 182, 183 located in different areas of a base semiconductor substrate 102. For example, the different types of doped regions 182, 183 could include any combination of one or more types of enhanced resistivity regions and/or one or more types of diffusion barrier regions, in various embodiments.

Again, similar to the previously described semiconductor device 100 (FIGS. 1, 5A), semiconductor device 300 includes a semiconductor substrate 114, isolation regions 120, and an active region 130 within which a transistor is formed. In addition, semiconductor device 300 includes one or more "inactive regions" 132 that do not include active transistor devices, but which instead may include other electrical structures (e.g., transmission lines, integrated inductors, integrated capacitors), represented by conductive element 510, formed over the base semiconductor substrate 102. The transistor includes a gate electrode 140, first and second current carrying contacts 150, 160, and a channel 109. The semiconductor substrate 114 includes a base semiconductor substrate 102, a nucleation layer 104, a buffer layer 106, a channel layer 108, a barrier layer 110, and a cap layer 112. In an embodiment, the base semiconductor substrate 102 includes a high-resistivity, NID, silicon substrate with a <1 1 1> crystal lattice orientation.

One or more ion species are intentionally introduced into the base semiconductor substrate 102, as described in conjunction with FIGS. 3C and 3D, to form different types of doped regions 182, 183 at and below the surface of the base semiconductor substrate 102. First doped region(s) 182 have first lower boundaries 192 between the upper and lower surfaces of the base semiconductor substrate 102, and second doped region(s) 183 have second lower boundaries 193 between the upper and lower surfaces of the base semiconductor substrate 102, where the first and second lower boundaries 192, 193 may be at substantially the same depth below the upper surface of the base semiconductor substrate 102, or at different depths, as previously described. For example, the first and second lower boundaries 192, 193 of the doped regions 182, 183 may be in a range of about 500 angstroms (0.05 microns) to about 100,000 angstroms (10 microns) below the upper surface of the base semiconductor substrate 102, or in a range of about 1000 angstroms (0.1 microns) to about 30,000 angstroms (3.0 microns) below the upper surface of the base semiconductor substrate 102, although the lower boundaries 192, 193 may be located at shallower or deeper distances below the upper surface of the base semiconductor substrate 102, as well.

The one or more ion species introduced into the base semiconductor substrate 102 may include one or more of phosphorus, arsenic, antimony, bismuth, argon, helium, nitrogen, oxygen, or other suitable ion species. The dopant concentration of the one or more ion species within the doped regions 182, 183 may be between about $10^{15}$ cm$^{-3}$ and about $10^{19}$ cm$^{-3}$ in some embodiments and may be between about $5 \times 10^{15}$ cm$^{-3}$ and about $1 \times 10^{18}$ cm$^{-3}$ in other embodiments, though other higher or lower concentrations may be used. In an embodiment in which the ion species includes oxygen, an annealing process may be performed to convert one or both of the doped regions 182, 183 into $Si_xO_{2-x}$ layer(s).

Each of the doped regions 182, 183 may correspond to a diffusion barrier region and/or an enhanced resistivity region, in various embodiments. According to a particular embodiment, the doped region 183 located below the active region 130 of the device 100 more desirably corresponds to a diffusion barrier region, which includes compensating dopant ions selected from phosphorus, arsenic, antimony, and bismuth. However, the doped region 183 located below the active region 130 could correspond to an enhanced resistivity region, which includes compensating dopant ions selected from argon, helium, nitrogen, or oxygen, or an $Si_xO_{2-x}$ layer formed after introduction of oxygen ions into the doped region 183 and the performance of an annealing process (e.g., block 216, FIG. 2).

According to a further embodiment, the doped regions 182 located below the inactive regions 132 of the device 300 more desirably correspond to enhanced resistivity regions, which include compensating dopant ions selected from argon, helium, nitrogen, or oxygen, or $Si_xO_{2-x}$ layers formed after introduction of oxygen ions into the doped regions 182 and the performance of an annealing process (e.g., block 212, FIG. 2). Accordingly, the Q of the portions of the base semiconductor substrate 102 that include the doped regions 182 is higher than the Q of other portions of the base semiconductor substrate 102. This may, in turn, increase the Q of any transmission lines, electrical interconnects, passive devices (e.g., integrated capacitors, integrated spiral inductors, and so on), or other conductive features in inactive regions 132 that are formed over the more resistive doped region(s) 182.

Figure 5D:
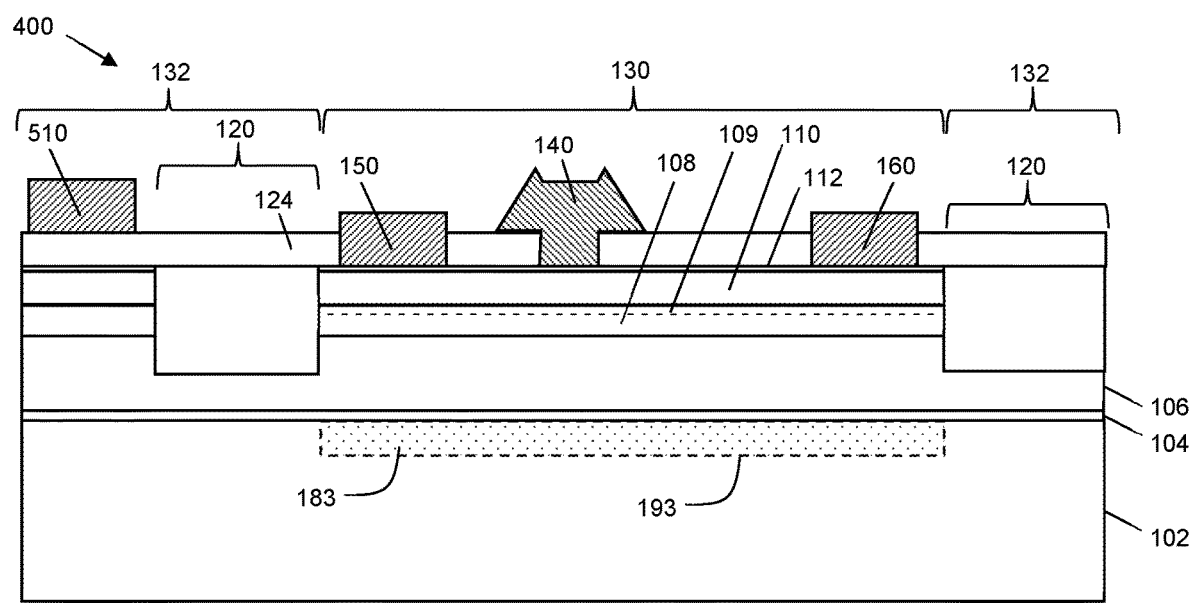
FIGS. 5D and 5E illustrate cross-sectional, side views of two additional example embodiments of semiconductor devices.

Although the embodiments of FIGS. 3D, 4C, and 5C depict two different types of selectively formed doped regions 182, 183, other devices may include only a single type of selectively formed doped region. For example, device 400 in FIG. 5D is substantially the same as device 300 in FIG. 5C, except that device 400 includes only doped regions 183 underlying the active region 130. Doped regions 182 under inactive regions 132 are not included in device 400. As described above, each of doped regions 183 may correspond to an enhanced resistivity region or a diffusion barrier region, where a diffusion barrier region may be preferable in some applications.

Figure 5E:
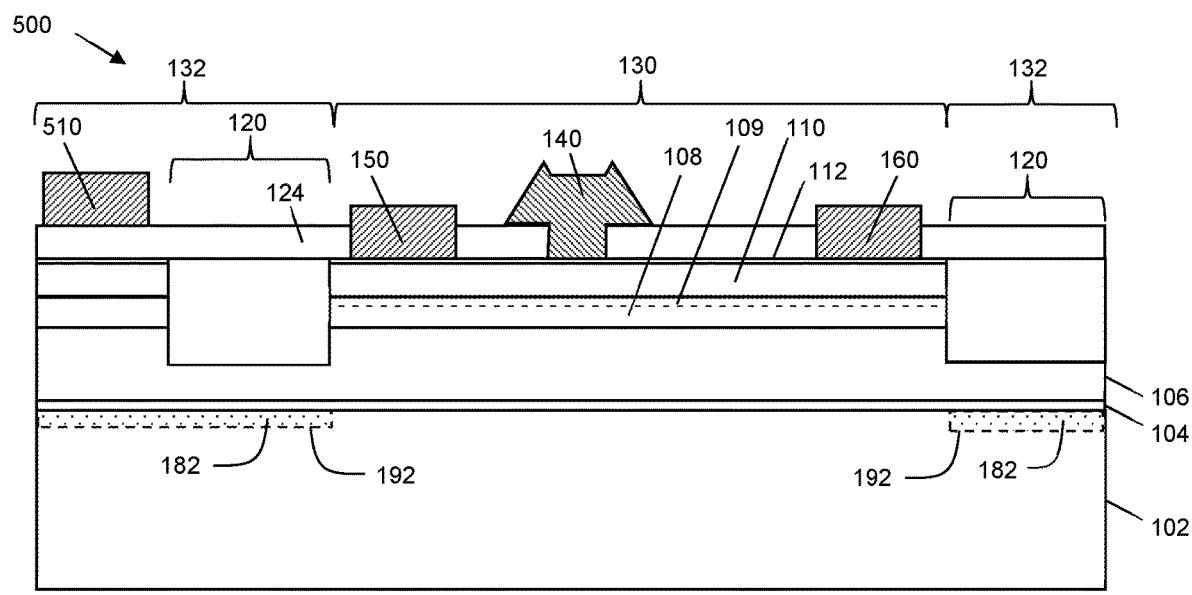

Conversely, for example, device 500 in FIG. 5E is substantially the same as device 300 in FIG. 5C, except that device 500 includes only doped regions 182 underlying the inactive regions 132. Doped regions 183 under active regions 130 are not included in device 500. As described above, each of doped regions 182 may correspond to an enhanced resistivity region or a diffusion barrier region, where an enhanced resistivity region may be preferable in some applications.

An embodiment of a semiconductor device includes a base substrate with upper and lower surfaces, a first doped region at the upper surface of the base semiconductor substrate, and a transistor over the upper surface of the base semiconductor substrate and formed from a plurality of epitaxially-grown semiconductor layers. The first doped region includes one or more ion species, and the first doped region has a first lower boundary that is located above the lower surface of the base semiconductor substrate. In further embodiments, the base semiconductor substrate is a silicon substrate, and the transistor is a GaN HEMT formed from a plurality of heteroepitaxial layers that include one or more materials selected from aluminum nitride and aluminum gallium nitride.

In further embodiments, the first doped region is a diffusion barrier region, and the one or more ion species are selected from phosphorus, arsenic, antimony, and bismuth. In other embodiments, the first doped region is an enhanced resistivity region, and the one or more ion species are selected from argon, helium, nitrogen, and oxygen. When the one or more ion species includes oxygen, the first doped region may include a silicon dioxide layer formed from annealing the first doped region after introduction of the oxygen.

In some embodiments, the first doped region is present at first selected areas of the base semiconductor substrate, and is not present at other areas of the base semiconductor substrate. For example, the first doped region may be a diffusion barrier region that is present at an active region of the device. Alternatively, the first doped region may be an enhanced resistivity region that is present at an inactive region of the device. In further embodiments, the device may include a second doped region at the upper surface of the base semiconductor substrate, where the second doped region includes the one or more ion species, the first doped region is a diffusion barrier region that is present at an active region of the device, and the second doped region is an enhanced resistivity region that is present at an inactive region of the device. The one or more ion species in the first doped region may be different from the one or more ion species in the second doped region.

An embodiment of a method of fabricating a semiconductor device includes forming one or more first doped regions at the upper surface of the base semiconductor substrate, where the one or more first doped regions include one or more ion species, and each of the one or more first doped regions has a first lower boundary that is located above the lower surface of the base semiconductor substrate. The method further includes forming a transistor over the upper surface of the base semiconductor substrate from a plurality of epitaxially-grown semiconductor layers. Forming the one or more first doped regions may include intentionally introducing the one or more ion species into the base semiconductor substrate or forming a doped semiconductor layer on and above the upper surface of the base semiconductor substrate, where the doped semiconductor layer is or includes the one or more first doped regions.

In a further embodiment, the one or more first doped regions are selectively formed at one or more first areas of the base semiconductor substrate, and are not present at other areas of the base semiconductor substrate. In another further embodiment, one or more second doped regions are selectively formed at the upper surface of the base semiconductor substrate at one or more second areas of the base semiconductor substrate, where each of the one or more second doped regions includes the one or more ion species, and each of the one or more second doped regions has a second lower boundary that is located above the lower surface of the base semiconductor substrate. Each of the one or more first doped regions may be a diffusion barrier region that is present at an active region of the device, and each of the one or more second doped regions may be an enhanced resistivity region that is present at an inactive region of the device.

According to a further embodiment, the base semiconductor substrate is a silicon substrate, the transistor is a gallium nitride (GaN) high electron mobility transistor, and forming the transistor comprises forming a plurality of heteroepitaxial layers over the base semiconductor substrate, where the plurality of heteroepitaxial layers include at least one layer that includes one or more materials selected from aluminum nitride and aluminum gallium nitride.

Although the illustrated and above-described semiconductor device has a particular HEMT structure, those of skill in the art would understand, based on the description herein, that various modifications may be made to produce differently configured structures that include the inventive subject matter. For example, a HEMT device with an enhanced resistivity region or a diffusion barrier region below the channel may include more and/or different semiconductor layers and/or other electrically-active or electrically-inactive structures. In addition, although the above-described device embodiments pertain to a HEMT device with a channel in the form of a 2-DEG, embodiments of doped regions may be incorporated into a HEMT device with a channel in the form of a two dimensional hole gas (2-DHG) near the interface between the channel and barrier layers, in other embodiments. In still other embodiments, an embodiment of a doped region may be incorporated into a device other than a HEMT device, including but not limited to metal semiconductor field effect transistors (MESFETs), metal-oxide semiconductor field effect transistors (MOSFETs), and laterally diffused MOSFETs (LDMOS FETs).

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the foregoing detailed description.

For the sake of brevity, conventional semiconductor fabrication techniques may not be described in detail herein. In addition, certain terminology may also be used herein for the purpose of reference only, and thus are not intended to be limiting, and the terms "first," "second," and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
    a base semiconductor substrate including an upper surface and a lower surface;
    a first doped region at the upper surface of the base semiconductor substrate, wherein the first doped region includes one or more ion species, and the first doped region has a first lower boundary that is located above the lower surface of the base semiconductor substrate, and an upper boundary that coincides with the upper surface of the base semiconductor substrate; and
    a transistor over the upper surface of the base semiconductor substrate and formed from a plurality of epitaxially-grown semiconductor layers, wherein the first doped region does not extend into the plurality of epitaxially-grown semiconductor layers, wherein the transistor is a high electron mobility transistor (HEMT), which includes
        a nucleation layer disposed over the first doped region,
        a first semiconductor layer disposed over the nucleation layer,
        a second semiconductor layer disposed over the first semiconductor layer, and
        a channel within the second semiconductor layer and proximate to an upper surface of the second semiconductor layer.

2. The semiconductor device of claim 1, wherein:
    the base semiconductor substrate is a silicon substrate; and the HEMT is a gallium nitride (GaN) HEMT formed from a plurality of heteroepitaxial layers that include one or more materials selected from aluminum nitride and aluminum gallium nitride.

3. The semiconductor device of claim 1, wherein the one or more ion species within the first doped region have a dopant concentration between $10^{15}$ cm$^{-3}$ and $10^{19}$ cm$^{-3}$.

4. A semiconductor device comprising:
a base semiconductor substrate including an upper surface and a lower surface, wherein the base semiconductor substrate comprises a high-resistivity, not-intentionally-doped (NID), silicon substrate with a <1 1 1> crystal lattice orientation;
a first doped region at the upper surface of the base semiconductor substrate, wherein the first doped region includes one or more ion species, and the first doped region has a first lower boundary that is located above the lower surface of the base semiconductor substrate; and
a transistor over the upper surface of the base semiconductor substrate and formed from a plurality of epitaxially-grown semiconductor layers.

5. A semiconductor device comprising:
a base semiconductor substrate including an upper surface and a lower surface;
a first doped region at the upper surface of the base semiconductor substrate, wherein the first doped region includes one or more ion species, the first doped region is a diffusion barrier region, the one or more ion species are selected from phosphorus, arsenic, antimony, and bismuth, and the first doped region has a first lower boundary that is located above the lower surface of the base semiconductor substrate, and an upper boundary that coincides with the upper surface of the base semiconductor substrate; and
a transistor over the upper surface of the base semiconductor substrate and formed from a plurality of epitaxially-grown semiconductor layers, wherein the first doped region does not extend into the plurality of epitaxially-grown semiconductor layers.

6. A semiconductor device comprising:
a base semiconductor substrate including an upper surface and a lower surface;
a first doped region at the upper surface of the base semiconductor substrate, wherein the first doped region includes one or more ion species, the first doped region is an enhanced resistivity region, the one or more ion species are selected from argon, helium, nitrogen, and oxygen, and the first doped region has a first lower boundary that is located above the lower surface of the base semiconductor substrate, and an upper boundary that coincides with the upper surface of the base semiconductor substrate; and
a transistor over the upper surface of the base semiconductor substrate and formed from a plurality of epitaxially-grown semiconductor layers, wherein the first doped region does not extend into the plurality of epitaxially-grown semiconductor layers.

7. A semiconductor device comprising:
a base semiconductor substrate including an upper surface and a lower surface;
a first doped region at the upper surface of the base semiconductor substrate, wherein the first doped region includes one or more ion species, the one or more ion species includes oxygen, the first doped region has a first lower boundary that is located above the lower surface of the base semiconductor substrate, and the first doped region is an enhanced resistivity region that includes a silicon dioxide layer formed from annealing the first doped region after introduction of the oxygen; and
a transistor over the upper surface of the base semiconductor substrate and formed from a plurality of epitaxially-grown semiconductor layers.

8. A semiconductor device comprising:
a base semiconductor substrate including an upper surface and a lower surface;
a first doped region at the upper surface of the base semiconductor substrate, wherein the first doped region includes one or more ion species, the first doped region is located at and below the upper surface of the base semiconductor substrate, the first doped region has a first lower boundary that is located above the lower surface of the base semiconductor substrate, and an upper boundary that coincides with the upper surface of the base semiconductor substrate, and the first lower boundary is in a range of 500 angstroms to 100,000 angstroms below the upper surface of the base semiconductor substrate; and
a transistor over the upper surface of the base semiconductor substrate and formed from a plurality of epitaxially-grown semiconductor layers, wherein the first doped region does not extend into the plurality of epitaxially-grown semiconductor layers.

9. A semiconductor device comprising:
a base semiconductor substrate including an upper surface and a lower surface;
a first doped region at the upper surface of the base semiconductor substrate, wherein the first doped region includes one or more ion species, the first doped region has a first lower boundary that is located above the lower surface of the base semiconductor substrate, and an upper boundary that coincides with the upper surface of the base semiconductor substrate, the first doped region is located in a heteroepitaxial semiconductor layer coupled to the upper surface of the base semiconductor substrate, and a thickness of the heteroepitaxial semiconductor layer is in a range of 500 angstroms to 100,000 angstroms; and
a transistor over the upper surface of the base semiconductor substrate and formed from a plurality of epitaxially-grown semiconductor layers, wherein the first doped region does not extend into the plurality of epitaxially-grown semiconductor layers.

10. A semiconductor device comprising:
a base semiconductor substrate including an upper surface and a lower surface;
a first doped region at the upper surface of the base semiconductor substrate, wherein the first doped region is a diffusion barrier region that is present at an active region of the device, the first doped region includes one or more ion species, and the first doped region has a first lower boundary that is located above the lower surface of the base semiconductor substrate, and wherein the first doped region is present at first selected areas of the base semiconductor substrate, and is not present at other areas of the base semiconductor substrate; and
a transistor over the upper surface of the base semiconductor substrate and formed from a plurality of epitaxially-grown semiconductor layers.

11. A semiconductor device comprising:
a base semiconductor substrate including an upper surface and a lower surface;

a first doped region at the upper surface of the base semiconductor substrate, wherein the first doped region is an enhanced resistivity region that is present at an inactive region of the device, the first doped region includes one or more ion species, and the first doped region has a first lower boundary that is located above the lower surface of the base semiconductor substrate, and wherein the first doped region is present at first selected areas of the base semiconductor substrate, and is not present at other areas of the base semiconductor substrate; and a transistor over the upper surface of the base semiconductor substrate and formed from a plurality of epitaxially-grown semiconductor layers.

12. A semiconductor device comprising:

a base semiconductor substrate including an upper surface and a lower surface;

a first doped region at the upper surface of the base semiconductor substrate, wherein the first doped region includes one or more ion species, and the first doped region has a first lower boundary that is located above the lower surface of the base semiconductor substrate, and wherein the first doped region is present at first selected areas of the base semiconductor substrate, and is not present at other areas of the base semiconductor substrate;

a transistor over the upper surface of the base semiconductor substrate and formed from a plurality of epitaxially-grown semiconductor layers; and a second doped region at the upper surface of the base semiconductor substrate, wherein the second doped region includes the one or more ion species, and the second doped region has a second lower boundary that is located above the lower surface of the base semiconductor substrate, and wherein the first doped region is a diffusion barrier region that is present at an active region of the device, and the second doped region is an enhanced resistivity region that is present at an inactive region of the device.

13. The semiconductor device of claim 12, wherein the one or more ion species in the first doped region are different from the one or more ion species in the second doped region.

* * * * *